(12) United States Patent
Ishizuka et al.

(10) Patent No.: US 6,256,329 B1
(45) Date of Patent: Jul. 3, 2001

(54) SEMICONDUCTOR LASER DRIVER CIRCUIT

(75) Inventors: Atsuo Ishizuka; Hiroyuki Rokugawa, both of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/215,154

(22) Filed: Dec. 18, 1998

(30) Foreign Application Priority Data

Mar. 11, 1998 (JP) .................................. 10-058733

(51) Int. Cl.[7] ................ H01S 3/30; H01S 3/13; H01S 3/00; H01S 5/00
(52) U.S. Cl. ................ 372/38.02; 372/8; 372/38.1; 372/30; 372/43
(58) Field of Search ................ 372/38.1, 38.02, 372/8, 30, 43

(56) References Cited

U.S. PATENT DOCUMENTS 3,896,398 * 7/1975 Ueki .................................. 332/7.51
4,998,257 * 3/1991 On et al. .................................. 372/38

FOREIGN PATENT DOCUMENTS 61-80922   4/1986 (JP).
62-224991 10/1987 (JP).

* cited by examiner

Primary Examiner—Robert H. Kim
Assistant Examiner—Armando Rodriguez
(74) Attorney, Agent, or Firm—Staas & Halsey LLP

(57) ABSTRACT

The larger the number of successive "0"s preceding a "1" in input data applied to a semiconductor laser, the longer the emission delay time of the laser. Accordingly, if a pulse signal for driving the semiconductor laser is made to rise earlier by an amount equivalent to the emission delay time conforming to the number of successive "0"s, thereby enlarging the pulse width, then the emission delay can be compensated for to eliminate pattern jitter irrespective of the number of successive "0"s. To accomplish this, a unit is provided for monitoring the number of successive "0"s in the input data, and a pulse-width adjustment circuit is provided for advancing the rise time of the laser driving pulse, thereby enlarging the pulse width, based upon the number of successive "0"s preceding a "1" in the input data.

14 Claims, 24 Drawing Sheets

IN CASE OF n=4

SEMICONDUCTOR LASER DRIVER CIRCUIT

BACKGROUND OF THE INVENTION

This invention relates to a semiconductor laser driver circuit and, more particularly, to a semiconductor laser driver circuit for suppressing jitter (pattern jitter) produced in dependence upon the signal pattern of input data, as a result of which there is no delay in light emission even when a semiconductor laser having a large threshold current is used.

An optical transmission apparatus that relies upon a semiconductor laser makes it possible to realize a transmission rate of several gigabits per second over a distance of tens of kilometers in a trunk-line system. Further, attempts have been made to perform transmission at a rate of a hundred megabits per second or more by multiplexing subscriber information in subscriber system communications.

The receiving section of an uplink optical transmission apparatus in a subscriber system collects signals from a number of subscribers. Consequently, if modulation of a semiconductor laser is carried out in the transmitting section on the subscriber side under conditions in which a bias current is being passed through the semiconductor laser at all times, the difference between the "1" and "0" levels of a received signal in the receiving section of the optical transmission apparatus will be too small. That is, the distinction ratio becomes so small as to degrade the reception characteristic.

FIG. 24 is a diagram useful in describing modulation of a semiconductor laser. Shown in FIG. 24 are a current vs. optical-power characteristic 101 of a semiconductor laser, in which Id represents diode current, $P_0$ the output power of the semiconductor laser, Ith the threshold current and Ib the bias current. If a pulsed current of the kind indicated by the solid line 102 is passed through a semiconductor laser in accordance with the "1", "0" logic levels of data, the semiconductor laser will output signal light that is intensity-modulated in the manner indicated at 103. Thus, if modulation of the semiconductor laser is performed in the presence of the bias current, the difference between the "1" and "0" levels diminishes, the distinction ratio decreases and the problem set forth above arises.

Accordingly, zero-biased modulation indicated by the phantom lines in FIG. 24 generally is used in the transmitting section on the subscriber side. With zero-biased modulation, however, the light emission is delayed when use is made of a semiconductor laser having a large threshold current Ith. Even if a semiconductor laser having a small threshold current Ith is employed, the light emission is still delayed when the transmission speed rises.

FIG. 25 illustrates graphically the pulse-modulated light output of a semiconductor laser. The waveform indicated by the dashed line is a modulated waveform in a case where a DC bias current in the vicinity of or greater than the threshold current has been applied. The solid line indicates a modulated waveform in a case where no DC bias current has been applied (i.e., at the time of zero bias). It will be appreciated from FIG. 25 that the light emission at the rising edge of the curve is delayed in so-called zero-bias modulation. The emission delay may be considered to be the time required for the filling of carriers commensurate with the threshold current.

In the case of an actual signal, it is necessary to regard strings of pulses in a pulse train as being random, and it is known that the emission delay varies depending upon the pattern of pulses in the pulse train. This is caused by a fluctuation in the level of residual carriers that remain in the semiconductor laser, the fluctuation depending upon whether the immediately preceding train of pulses is composed of "0"s or "1" s. A case in which there are many of such residual carriers approximates a case where a DC bias is applied, resulting in a shorter emission delay time. Conversely, a case in which there are few residual carriers approximates pure zero-bias modulation, resulting in a longer emission delay time. This phenomenon is referred to as the "pattern effect" and is known as pattern jitter in zero-bias modulation. Pattern jitter is a major problem in that it causes error in terms of transmission signal identification and detracts from the reliability of an optical transmission apparatus.

In order to prevent such pattern jitter, methods adopted heretofore include a method of adding a waveform, which is obtained by integrating the pulse itself, onto the rising edge of the pulsed modulating signal to hasten the rise time of the modulating signal and broaden the pulse width, thereby compensating for the emission delay time of the waveform after modulation; a method of applying undershoot to the falling edge of the pulsed modulating signal to forcibly extract residual carriers; and a method of broadening pulse width of the modulating signal by superposing waveforms before and after delay using a delay element having the same delay as the emission delay, thereby compensating for the emission delay. These methods, however, do not make it possible to suppress pattern jitter that is dependent upon a fluctuation in emission delay.

SUMMARY OF THE INVENTION

As mentioned above, rising-edge pattern jitter due to a delay in light emission causes a decline in transmission quality in zero-bias modulation. In particular, in a subscriber's optical transceiver in which a burst transmission that suddenly changes from a state in which a signal is present to a state in which a signal is absent is carried out, a problem which arises is that the emission delay varies greatly depending upon the pattern of the transmitted data.

Accordingly, the present invention has been devised in view of the foregoing problems of the prior art and its object is to provide a low-cost, highly versatile optical transmission apparatus in which a high-quality signal transmission is made possible by reducing rising-edge pattern jitter in zero-bias modulation.

In accordance with the present invention, the foregoing object is attained by providing a semiconductor laser driver circuit for driving a semiconductor laser by a pulse signal having levels conforming to "1", "0" logic values of input data, comprising a code detection circuit for detecting a predetermined code, which comprises a plurality of successive logic values, from input data, and a pulse-width adjustment circuit for adjusting pulse width of the pulse signal based upon the detected code, and outputting a signal indicative of the adjusted pulse width.

Further, in accordance with the present invention, the foregoing object is attained by providing a semiconductor laser driver circuit for driving a semiconductor laser by a pulse signal having levels conforming to "1", "0" logic values of input data, comprising a monitoring unit for monitoring the number of successive "0"s in input data when a logic value which prevails when a current is passed through the semiconductor laser is "1" and a logic value which prevails when a current is not passed through the semiconductor laser is "0", and a pulse adjustment circuit for enlarging pulse width of the pulse signal in dependence upon the number of successive "0" s which precede a "1" in the input data, and outputting a signal indicative of the enlarged pulse width.

Other features and advantages of the present invention will be apparent from the following description taken in conjunction with the accompanying drawings.

DESCRIPTION OF THE PREFERRED EMBODIMENTS (A) Overview of the Invention

Figure 1:
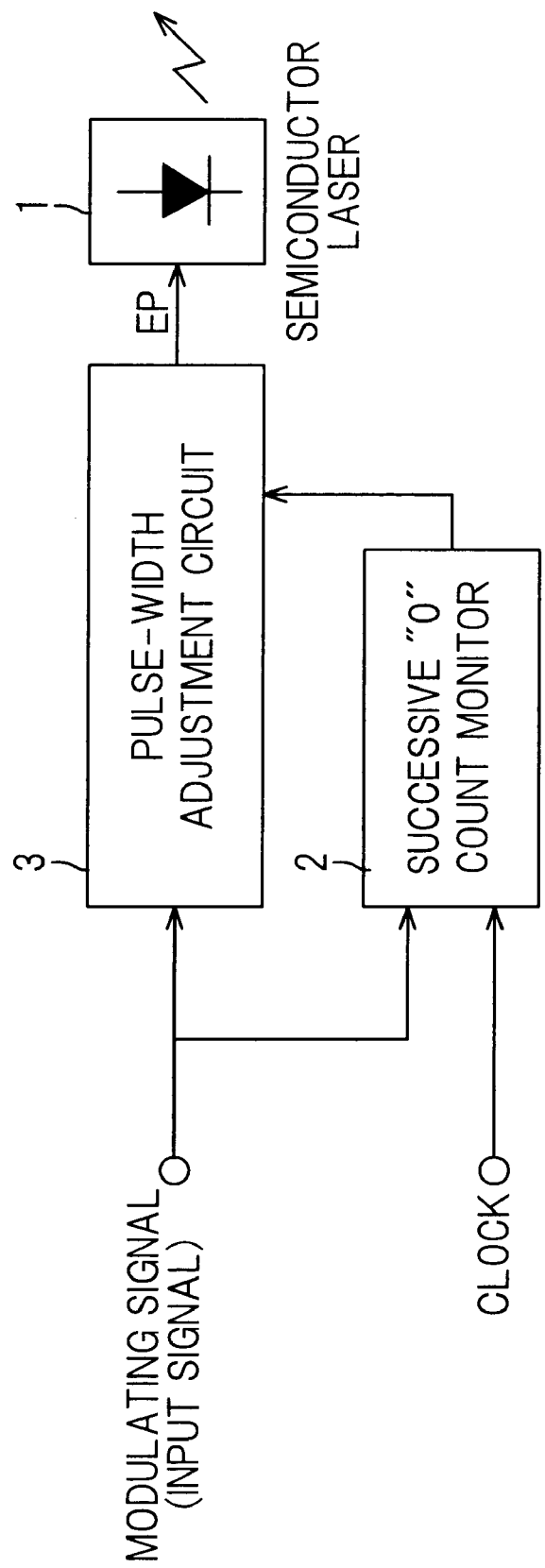
FIG. 1 is a diagram useful in describing an overview of the present invention.

FIG. 1 is a diagram useful in describing the principles of the present invention and shows a semiconductor laser 1 a monitoring unit 2 for monitoring the number of successive "0"s of input data (the modulating signal) and a pulse-width adjustment circuit 3. A pulse signal (a pulse signal for driving the semiconductor laser) EP is input to the semiconductor laser 1. The pulse width of the pulse signal EP is enlarged based upon the number of successive "0"s preceding a "1" in the input data.

The larger the number of successive "0"s preceding a "1" in the input data, the larger the light-emission delay time of the semiconductor laser 1. If the pulse signal EP for driving the semiconductor laser is made to rise early and the pulse width thereof is enlarged by an amount commensurate with the emission delay time that conforms to the number of successive "0"s, pattern jitter can be eliminated by compensating for emission delay without relation to the number of successive "0" s. To accomplish this, the monitoring unit 2 monitors the number of successive "0"s in the input data (modulating signal), and the pulse-width adjustment circuit 3 hastens the rise time of the laser driving pulse signal and enlarges the pulse width on the basis of the number of successive "0"s preceding a "1" in the input data.

The monitoring unit 2 which monitors the number of successive "0" s can be implemented by a code detection circuit for detecting a predetermined code comprising a plurality of successive "1" s or "0" s in the input data or by a "0" counting circuit for counting the number of "0"s .

On the basis of the relationship between the number n of successive "0" s in input data and the emission delay time τd of a light pulse output by the semiconductor laser, the pulse-width adjustment circuit 3 hastens the pulse signal rise time, which is due to a "1" following the actual number n of successive "0"s, by an amount equivalent to the emission delay time, thereby enlarging the pulse width.

In a case where the number of successive "0" s exceeds a predetermined number N, the pulse-width adjustment circuit 3 fixes the amount of pulse width enlargement at a constant value. The reason for this is that the emission delay time becomes a substantially constant value when the number of successive "0"s exceeds the fixed value N. In such case the pulse-width adjustment circuit 3 obtains, from the relationship between "0" duration and the emission delay time of the light pulses, a "0" duration for which the emission delay time will become constant, and decides the number N of successive "0"s for which the emission delay time will become constant, the decision being based upon the "0" duration and the bit rate of the input data.

In a first example of construction of the pulse-width adjustment circuit 3, the pulse-width adjustment circuit 3 comprises (1) a first delay unit for making the delay time of input data longer the smaller the number of successive "0"s; (2) a second delay unit for delaying the input data by an amount equivalent to a maximum delay time set in the first delay unit; and (3) a pulse signal output unit for combining outputs of the first and second delay units conforming to the number of successive "0"s and outputting the pulse signal EP for driving the semiconductor laser. In accordance with this first example, the larger the number of successive "0"s, the earlier the rise of the laser driving signal can be made and the more the pulse width can be enlarged.

In a second example of construction of the pulse-width adjustment circuit 3, the pulse-width adjustment circuit 3 comprises (1) a variable-duty pulse generating circuit for outputting a pulse signal having a duty conforming to the number of successive "0"s, and (2) a controller for selecting a pulse signal, which conforms to the number of successive "0"s, from the output of the variable-duty pulse generating circuit. In accordance with the second example as well, the larger the number of successive "0"s, the earlier the rise of the laser driving signal can be made and the more the pulse width can be enlarged.

In a third example of construction of the pulse-width adjustment circuit 3, the pulse-width adjustment circuit 3 comprises (1) a pulse signal output unit for latching input data and outputting the pulse signal EP for driving the semiconductor laser; (2) a clock delay unit for generating a plurality of clock signals having delay times that differ from one another; and (3) a clock selection unit for selecting a prescribed clock signal. The larger the number of successive "0"s, the shorter the delay time of the clock signal selected by the pulse signal output unit. The input data is latched by the above-mentioned clock signal to advance the rise of the pulse signal EP and enlarge the pulse width.

In a fourth example of construction of the pulse-width adjustment circuit 3, the pulse-width adjustment circuit 3 comprises (1) a slanting circuit for slanting the rising and falling edges of the input data waveform; (2) a discrimination-level control circuit for reducing discrimination level based upon the number of successive "0"s; and (3) means for comparing the output of the slope circuit and the discrimination level and outputting the pulse signal EP for driving the semiconductor laser. In accordance with the fourth example as well, the larger the number of successive "0"s, the earlier the rise of the laser driving signal can be made and the more the pulse width can be enlarged.

In a fifth example of construction of the pulse-width adjustment circuit 3, the pulse-width adjustment circuit 3 comprises (1) a voltage-controlled-type delay line for delaying input data, wherein the delay time of the delay line can be varied by an applied voltage; (2) a level control circuit for controlling the level of voltage input to the voltage-controlled-type delay line based upon the number of successive "0"s; and (3) means for combining the input data and the delayed data signal output by the delay line, thereby producing and outputting the pulse signal. In accordance with the fifth example as well, the larger the number of successive "0"s, the earlier the rise of the laser driving signal can be made and the more the pulse width can be enlarged.

In a sixth example of construction of the pulse-width adjustment circuit 3, the number of successive "0"s is divided into two cases, namely a case in which the number of successive "0" s is two or greater and a case in which the number of successive "0"s is one or less, and the pulse width is controlled separately in each case. Here pulse width can be controlled by performing monitoring to determine whether the number of successive "0" s is two or greater. Further, by detecting a pattern in which a code of three successive bits in the input data is "101", it can be determined that the number of successive "0" bits is one or less, whereupon pulse width control can be carried out accordingly.

(B) Principle of the Invention

Figure 2:
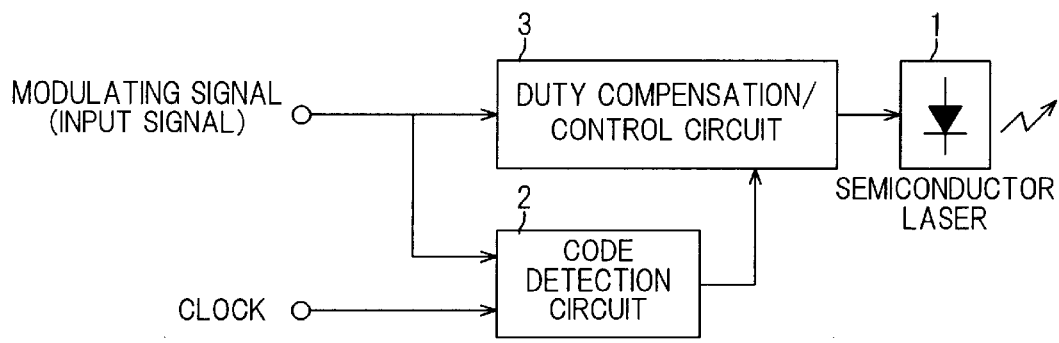
FIG. 2 is a diagram showing the construction of a semiconductor laser driver circuit.
Figure 3:
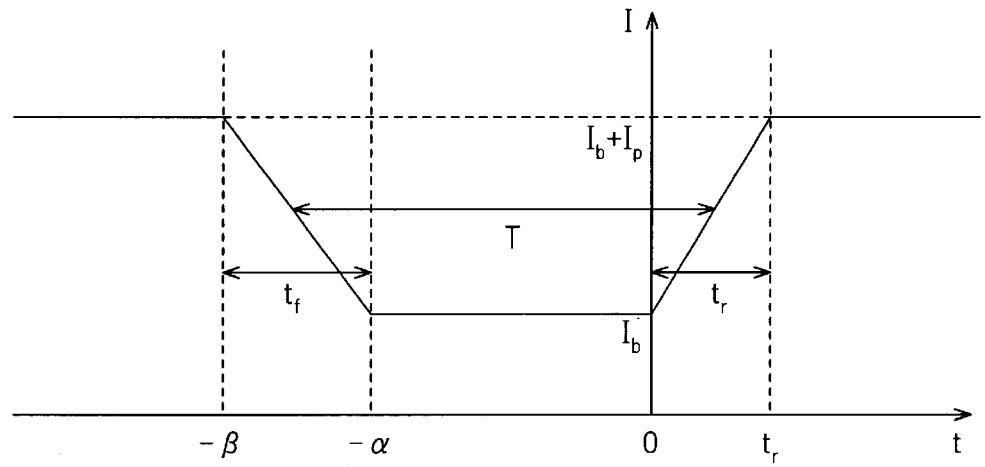
FIG. 3 is an electrical waveform model of a modulating signal.

FIG. 2 is a diagram showing the construction of a semiconductor laser driver circuit for describing the principle of the present invention, and FIG. 3 is an electrical waveform model of a modulating signal (input data) input to the semiconductor laser in order to intensity-modulate the output light of the semiconductor laser.

The semiconductor laser driver circuit of FIG. 2 is so adapted that the modulating signal (input data) that drives the semiconductor laser 1 is branched so as to enter a duty compensation/control circuit (the pulse-width adjustment circuit) 3 and a code detection circuit (the monitoring unit for monitoring the number of successive "0" s) 2. On the basis of the pattern (data pattern) of the modulating signal, the code detection circuit 2 predicts emission delay time developed by the semiconductor laser 1 and outputs this information to the duty compensation/control circuit 3. On the basis of the information from the code detection circuit 2, the duty compensation/control circuit 3 controls the pulse width of the modulating signal so as to compensate for the duty of the light output waveform resulting from the emission delay time. The amount of duty compensation can be obtained by calculation set forth below.

In the electrical waveform model of the modulating signal of FIG. 3, emission delay time $t_d$ generally is obtained by assuming the driving current and solving a rate equation. Consider an input having a certain "0" duration T, as shown in FIG. 3. If the driving current waveform has a rise time $t_r$ (0%)–$t_r$(100%) and a decay time $t_f$(0%)–$t_f$(100%), then the time from the center of the falling edge to the center of the rising edge is T. The driving current I(t) at this time is represented by the following:

$$I(t) = \begin{cases} I_b + I_p & (t \leq -\beta) \\ I_b + I_p - \dfrac{I_p}{t_f}(t+\beta) & (-\beta < t \leq -\alpha) \\ I_b & (-\alpha < t \leq 0) \\ I_b + \dfrac{I_p}{t_r} \cdot t & (0 < t \leq t_r) \\ I_b + I_p & (t_r < t) \end{cases}$$

where $\alpha = T - (t_r + t_f)/2$, $\beta = T - (t_r - t_f)/2$ hold.

The rate equation relating to carrier density is solved, where N, $\tau_s$, e, V and $N_{th}$ represent carrier density, carrier life, electric charge, volume of the active layer and threshold carrier density, respectively.

$$\frac{dN(t)}{dt} = -\frac{N(t)}{\tau_s} + \frac{I(t)}{eV}, \quad N < N_{th} \qquad (1)$$

$$N(t) = e^{\frac{t}{\tau_s}}\left\{C + \frac{1}{eV}\int_t^x e^{\frac{x}{\tau_s}} I(x)dx\right\}$$

From this we have $$N(t) = \begin{cases} N_{th} & (t \leq -\gamma) \\ C_1 e^{\frac{t}{\tau_s}} + N_b + \left(1 - \dfrac{t+\beta-\tau_s}{t_f}\right) N_p & (-\gamma < t \leq -\alpha) \\ C_2 e^{\frac{t}{\tau_s}} + N_b & (-\alpha < t \leq 0) \\ C_3 e^{\frac{t}{\tau_s}} + N_b + \dfrac{t-\tau_s}{t_r} \cdot N_p & (0 < t \leq t_r) \\ C_4 e^{\frac{t}{\tau_s}} + N_b + N_p & (t_r < t) \end{cases} \qquad (2)$$

where the following hold:

$$C_1 = e^{\frac{\gamma}{\tau_s}} \left\{ N_{th} - N_b - \left(1 + \frac{\tau_s + \alpha - \beta}{t_f}\right) N_p \right\}$$

$$C_2 = C_1 + e^{\frac{\alpha}{\tau_s}} \left(1 + \frac{\tau_s + \alpha - \beta}{t_f}\right) N_p$$

$$C_3 = C_2 + \frac{\tau_s}{t_r} \cdot N_p$$

$$C_4 = C_3 - \frac{\tau_s}{t_r} \cdot e^{\frac{t_r}{\tau_s}} N_p$$

Here the emission delay time $t_d$ is the time required for the carrier density $N(t)$ to become $N_{th}$. If the $t_d$ for which $N(t_d) = N_{th}$ holds is obtained, Equation (2) becomes as follows:

$$\begin{cases} t_d \approx \dfrac{\dfrac{k}{\tau_s} - \dfrac{1}{t_r} + \sqrt{\dfrac{1}{t_r} - \left(\dfrac{k}{\tau_s}\right)^2 - \dfrac{2k(I_b - I_{th})}{\tau_s^2 I_p}}}{\dfrac{k}{\tau_s^2}} & (0 < t_d \le t_r) \\ t_d = \tau_s \ln\left(\dfrac{-k' I_p}{I_p + I_b - I_{th}}\right) & (t_r < t_d) \end{cases} \quad (3)$$

where by the following equations hold:

$$k = e^{\frac{\gamma}{\tau_s}} \left\{ \frac{I_{th} - I_b}{I_p} - \left(1 + \frac{\tau_s + \gamma - \beta}{t_f}\right) \right\} + e^{\frac{\alpha}{\tau_s}} \left(1 + \frac{\tau_s + \alpha - \beta}{t_f}\right) + \frac{\tau_s}{t_r}$$

$$k' = k - \frac{\tau_s}{t_r} \cdot e^{\frac{t_r}{\tau_s}}$$

$$\alpha = T - \frac{t_r + t_f}{2}$$

$$\beta = T - \frac{t_r - t_f}{2}$$

$$\gamma = \beta - \frac{t_f}{I_p}(I_b + I_p - I_{th})$$

The relationship between the "0" duration T and the emission delay time $t_d$ is known from Equation (3). That is, if the rise time $t_r$ and decay time $t_f$ of the driving current waveform and the carrier life $\tau_s$, threshold current $I_{th}$, bias current $I_b$ and pulsed current $I_p$ of the semiconductor laser are given, the relationship between the "0" duration T and the emission delay time $t_d$ can be obtained from Equation (3) and the duty compensation circuit can be designed in conformity with the "0" duration T.

(C) Embodiments (a) First Embodiment

Figure 4:
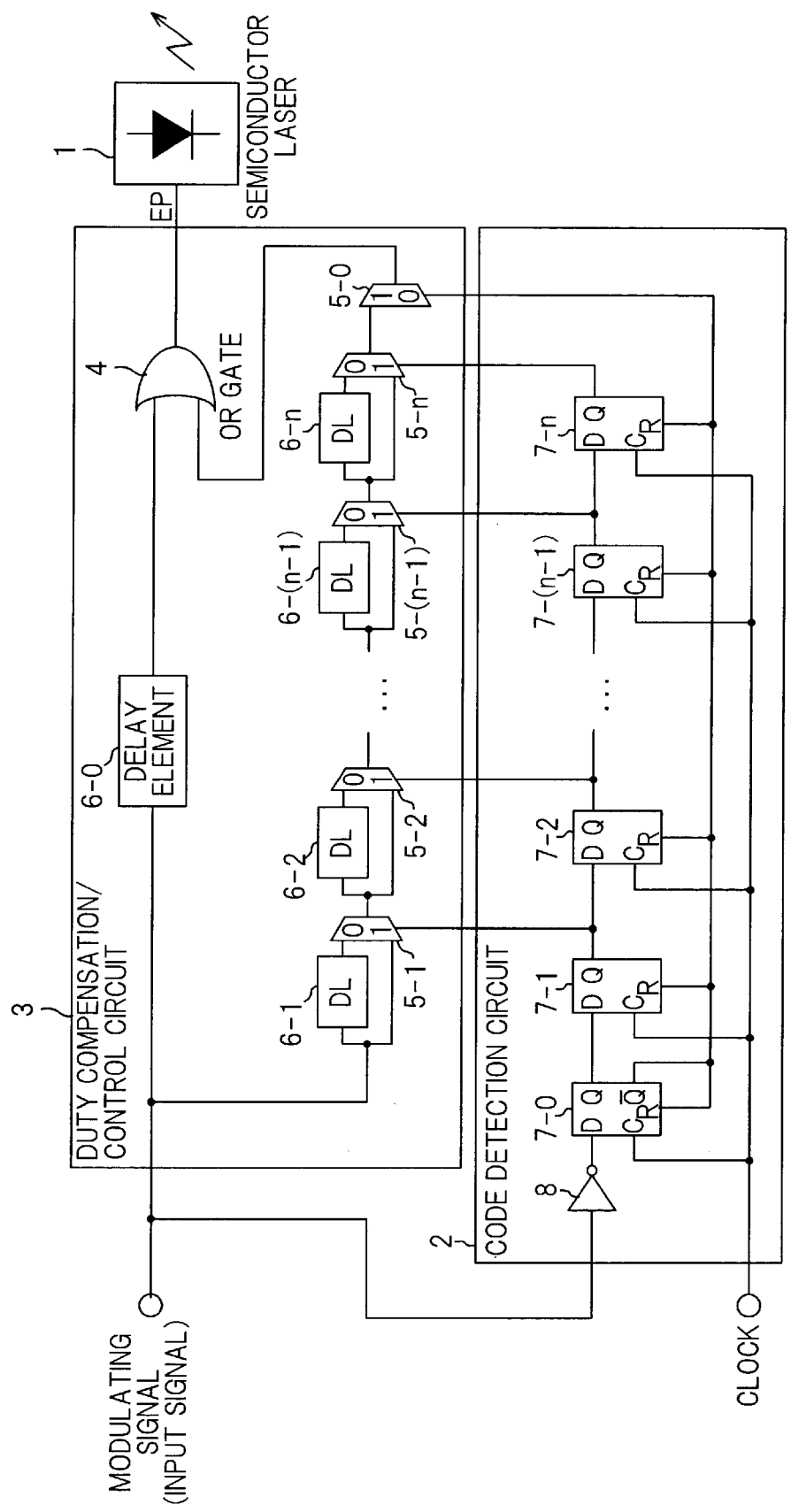
FIG. 4 is a diagram showing the construction of a first embodiment of a semiconductor laser driver circuit according to the present invention.
Figure 5:
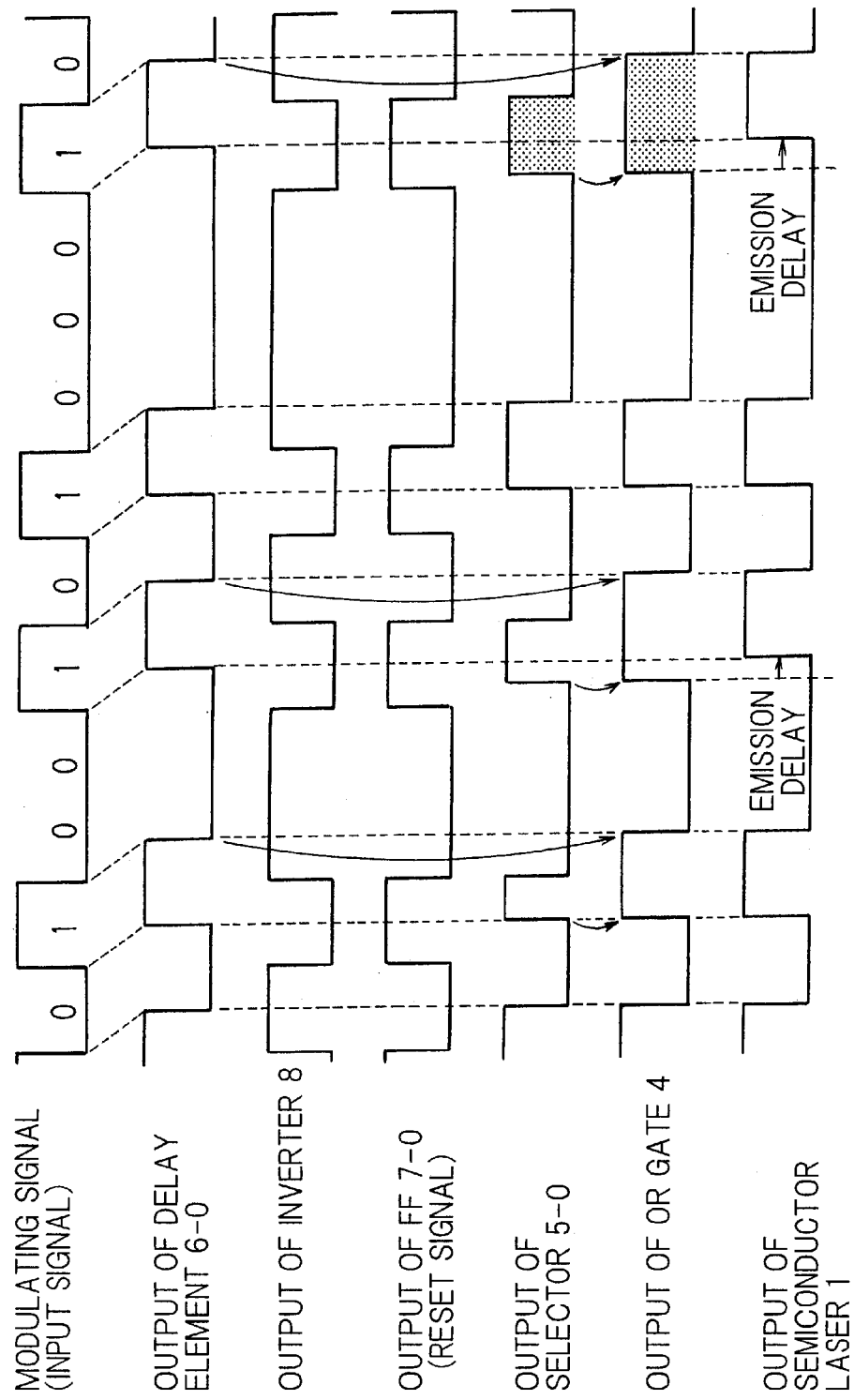
FIG. 5 is a timing chart of various signals associated with the first embodiment.

FIG. 4 is a diagram showing the construction of a first embodiment of a semiconductor laser driver circuit according to the present invention, and FIG. 5 is a timing chart according to the first embodiment. The semiconductor laser driver circuit drives the semiconductor laser 1 by a pulse signal whose high and low levels conform to the logic values ("1", "0") of the modulating signal (input data).

Shown in FIG. 4 are the semiconductor laser 1 the code detection circuit 2 for detecting the code of the input data and the duty compensation/control circuit 3 (pulse-width adjustment circuit) for adjusting and outputting, on the basis of the detected code, the pulse width of the pulse signal that drives the semiconductor laser 1. The duty compensation/control circuit 3 includes an OR gate 4; selectors 5-0 through 5-n; and delay elements 6-0, 6-1 through 6-n. The delay time of the delay element 6-0 is set to be equal to the total of the delay times of the delay elements 6-1 through 6-n. The code detection circuit 2 includes flip-flops 7-0 through 7-n, each of which has a data input terminal D, a clock terminal C, a reset terminal R and a Q (set) output terminal; and an inverter 8 for inverting logic values.

The entered modulating signal (data signal) is branched to the code detection circuit 2 and duty compensation/control circuit 3. The modulating signal inverted by passage through the inverter 8 enters the flip-flop (abbreviated to "FF" below) 7-0. The FFs 7-1 through 7-n construct a shift register in which the set state of a preceding stage is shifted by the generation of a clock signal synchronized to the bit rate of the data. When the input modulating signal becomes logical "1", the FF 7-0 is reset so that its inverted Q output terminal delivers logical "1". This logic enters all of the FFs 7-0 through 7-n as a reset signal, as a result of which all of these FFs are reset at the occurrence of the next clock signal.

Accordingly, if the number of successive "0"s is one, only the FF 7-0 is set by the "0" and is reset by the next "1". If the number of successive "0" s is two, then the FFS 7-0, 7-1 are set by the two successive "0" s and are reset by the next "1". If the number of successive "0" is three, then the FFS 7-0, 7-1, 7-2 are set by the three successive "0" s and are reset by the next "1". Thus, if the number of successive "0" s is (n+1) or greater, all of the FFs 7-0 through 7-n are set; all of the FFs 7-0 through 7-n are reset by the occurrence of a "1".

If the number of successive "0"s is one or less, the Q outputs of FFs 7-1 through 7-n all become "0" and all of the delay elements 6-1 through 6-n are selected by the corresponding selectors 5-1 through 5-n. As mentioned above, the delay time of the delay element 6-0 is equivalent to the sum of the delay times of the delay elements 6-1 through 6-n. If all of the delay elements 6-1 through 6-n are selected, therefore, the phase difference between the two modulating signals input to the two input terminals of the OR gate 4 will be zero. As a result, If the number of successive "0" s is one or less, the pulse width of the pulse signal EP for driving the semiconductor laser will not be enlarged.

On the other hand, if the number of successive "0" s is x, the Q outputs of the FFs 7-0 through 7-(x–1) become "0" and "1" signals are sent to the selectors 5-1 through 5-(x–1). Consequently, the selectors 5-1 through 5-(x–1) select bypass lines that do not pass through the delay elements 6-1 through 6-n. Meanwhile, since the Q outputs of the FFs 7-x through 5-(x–1) are logical "0", "0" signals are sent to the selectors 5-x through 5-n. The selectors 5-x through 5-n, therefore, select the delay elements 6-x through 6-n. As a result, a delay that is the total of the delays of the delay elements 6-x through 6-n is added onto the signal that arrives at the selector 5-0 and a phase difference develops between the two modulating signals applied to the input terminals of the OR gate 4. That is, the modulating signal output by the selector 5-0 has a phase that leads the phase of the modulating signal output by the delay element 6-0 by an amount equivalent to the total delay time of the delay elements 6-x through 6-n. As a result, the rising edge of the pulse signal EP for driving the semiconductor laser output by the OR gate 4 occurs earlier and, hence, the pulse width is enlarged.

Accordingly, by adopting a design in which the amount of phase advance is made equal to the amount of emission delay when the number of successive "0" s is x, the duty of the light output waveform can be adjusted to eliminate pattern jitter.

(b) Modifications of First Embodiment (b-1) Principles of Modifications

Figure 6:
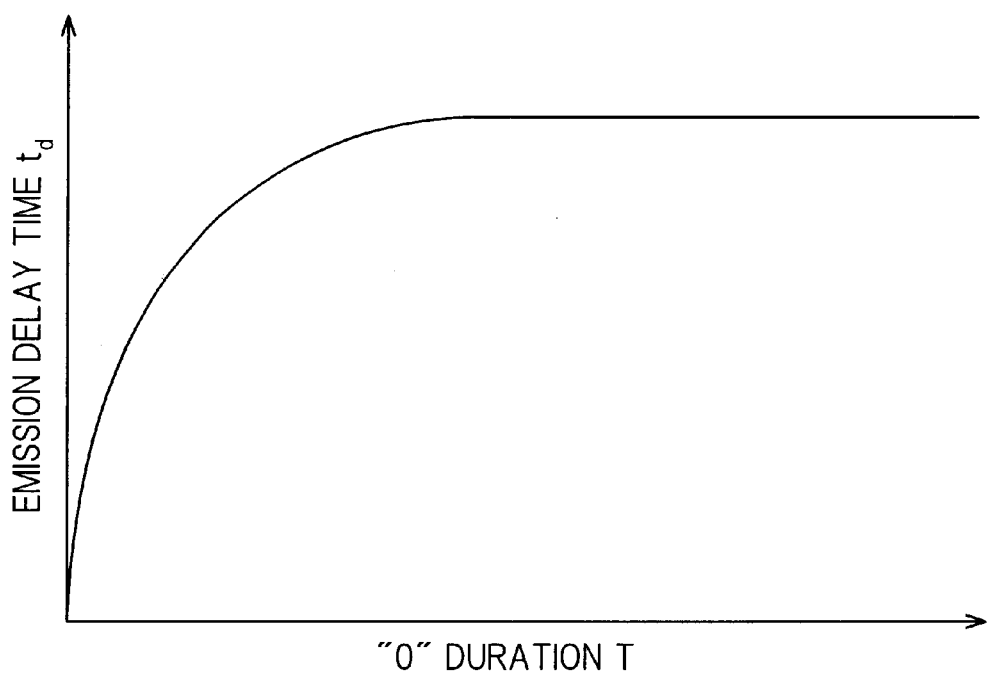
FIG. 6 is a diagram showing the relationship between "0" duration T and emission delay time.

If the relationship between the "0" duration T and the emission delay time $t_d$ analyzed in accordance with FIG. 3 is represented by a graph, the result will be as illustrated in FIG. 6, in which the emission delay time $t_d$ gradually approaches a constant value. More specifically, if the number of successive "0"s is n or greater, the emission delay time takes on a constant value. Accordingly, N can be decided on as the number of delay elements 6-1 through 6-n in the duty compensation/control circuit 3 and as the number of FFs 7-1 through 7-n in the code detection circuit 2.

The necessary number N of delay elements and FFs will be considered in greater detail. In the case of an ordinary semiconductor laser, it is known that the carrier life $\tau_s$ is several nanoseconds and, as a result, the calculated emission delay time $t_d$ will take on a constant value if the "0" duration is several nanoseconds or greater. For example, if calculation is performed based upon 100 ps as the rise and decay times $t_r$, $t_f$ of the electric input signal, 3 ns as the carrier life $\tau_s$ of the semiconductor laser, 1.7 mA as the threshold current $I_{th}$ and 1.5 mA as the bias current $I_b$, then the emission delay time $t_d$ will be rendered constant if the "0" duration is 8 ns or greater.

If the bit rate of the input modulating signal is 156 megabits per second, one cycle (one bit) of this input modulating signal will be 6.4 ns. If the "0" duration T is two bits or greater, therefore, then the emission delay time can be considered to be constant. Accordingly, it will be understood that circuitry should be designed that can detect a case where the number of successive "0"s is one or less and a case where the number of successive "0"s is two or greater.

To sum up the foregoing, the necessary number N is decided in accordance with (1) through (5) below.

(1) The rate equation is solved upon setting the parameters of the electric waveform model.

(2) The relationship between "0" duration T and emission delay time $t_d$ is formulated.

(3) The relationship between the number of successive "0"s and the emission delay time is graphed taking the bit rate of the input data into consideration.

(4) The amount of compensation necessary is decided.

(5) Finally, the necessary number N is decided.

(b-2) First Modification

Figure 7:
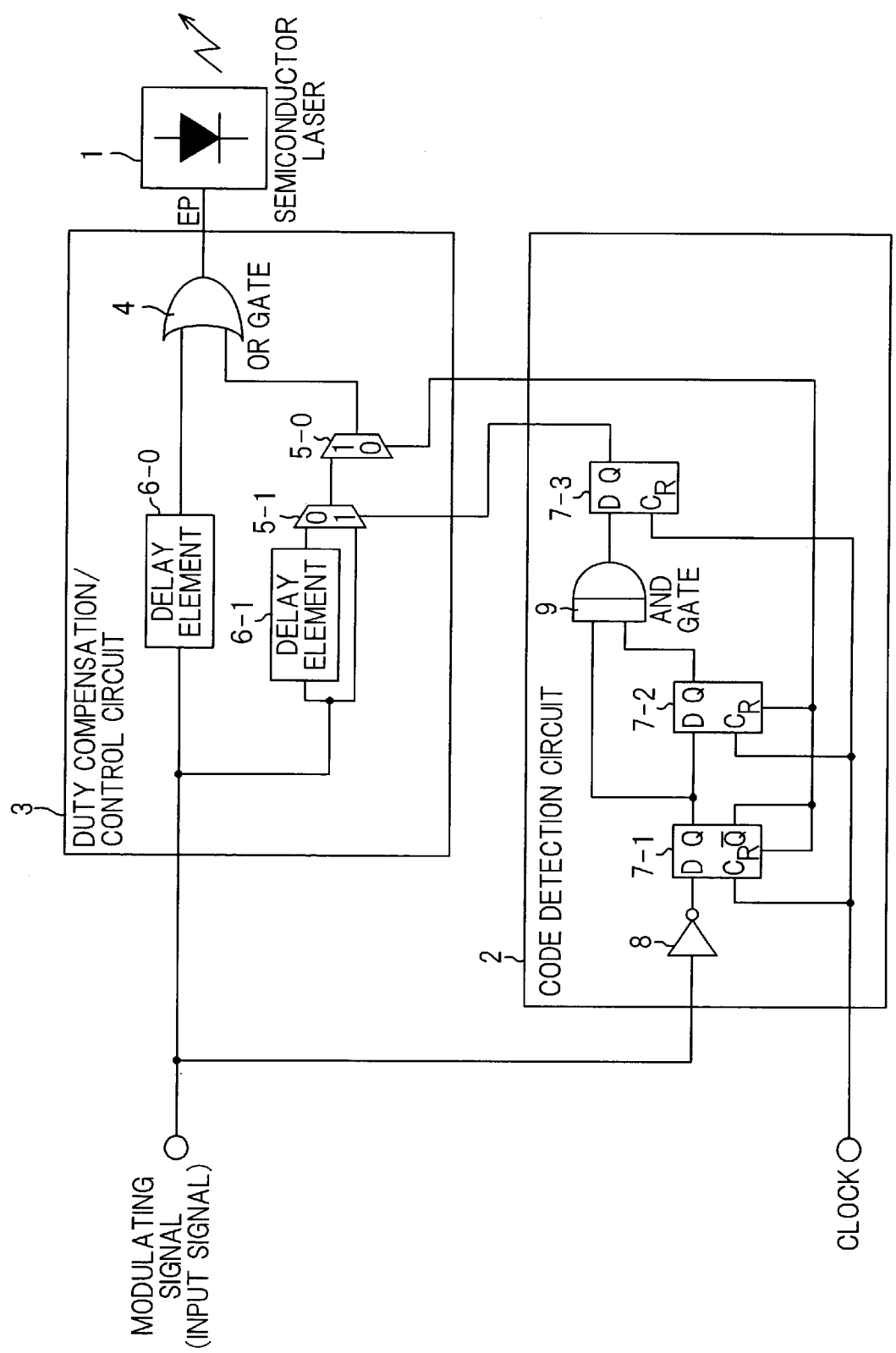
FIG. 7 is a diagram showing a modification (where n=2) of the first embodiment.
Figure 8:
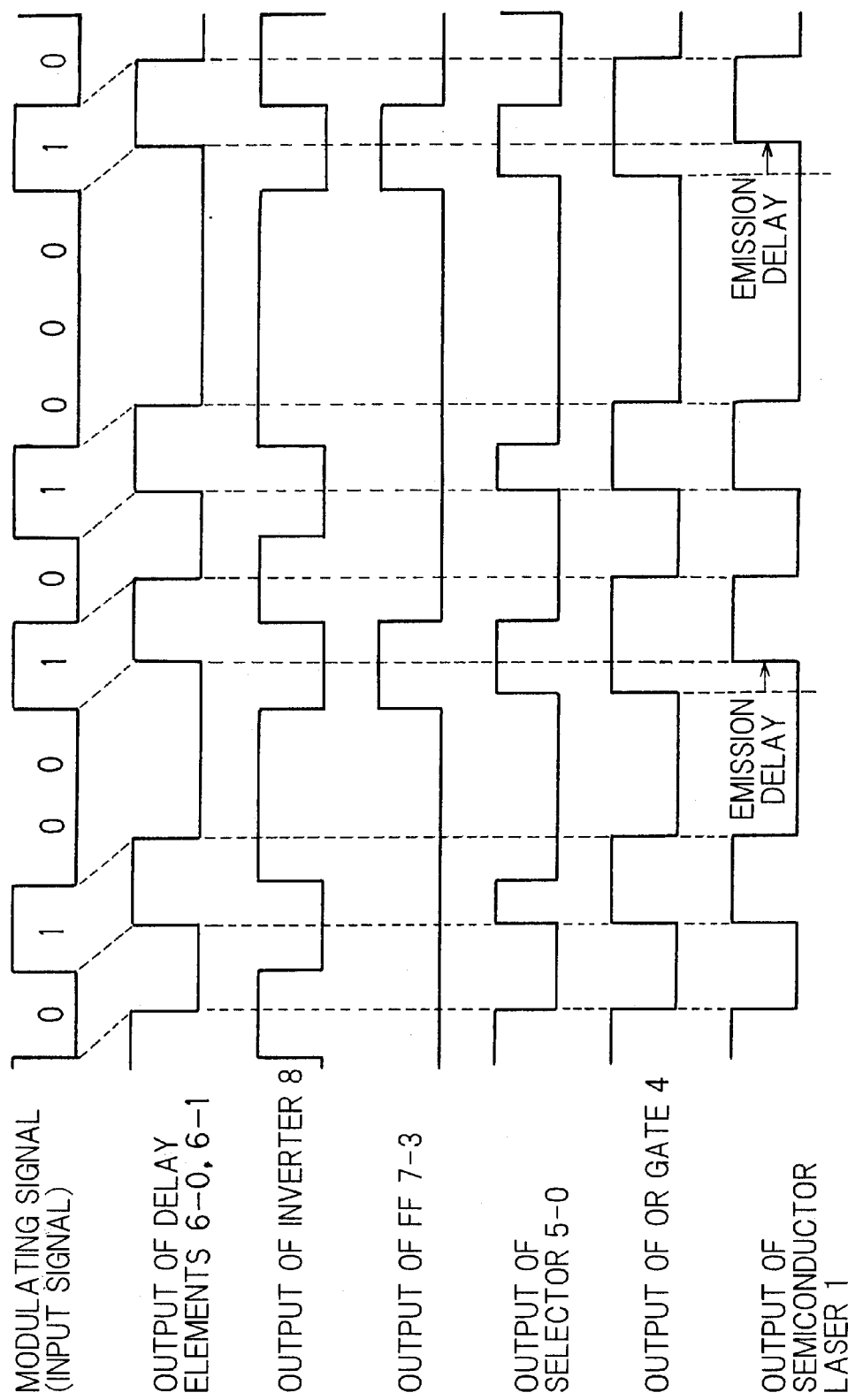
FIG. 8 is a timing chart of various signals associated with the modification of FIG. 7.

FIG. 7 is a diagram showing a modification (where N=2) of the first embodiment, and FIG. 8 is a timing chart of various signals associated with this modification. Components in FIG. 7 identical with those shown in FIG. 4 are designated by like reference characters. Numeral 9 denotes an AND gate.

According to this modification, a case where the number of successive "0"s is one or less and a case where the number of successive "0"s is two or greater are detected and the pulse width of the pulse signal EP for driving the semiconductor laser is controlled accordingly. The modulating signal (input data) that enters the code detection circuit 2 is inverted by the inverter 8. If the number of successive "0"s is two or greater, the Q outputs of the FFs 7-1, 7-2 both become logical "1". In this case only, therefore, the output of the AND gate 9 is logical "1". If the number of successive "0"s is one or less, on the other hand, the output of the AND gate 9 is logical "0". The output of the AND gate 9 is latched by the FF 7-3 and then enters the selector 5-1.

More specifically, in a case where the number of successive "0"s is one or less, the output of the AND gate 9 does not go to logical "1", the selector 5-1 selects the signal that has passed through the delay element 6-1 and the selector 5-0 selects the output of the selector 5-1. As a result, the modulating signal output by the selector 5-0 has the same phase as that of the modulating signal output by the delay element 6-0 and the pulse width of the pulse signal EP for driving the semiconductor laser is not enlarged.

If the number of successive "0"s is two, on the other hand, the output of the AND gate 9 becomes logical "1", the FF 7-3 is set the next time a "1" enters and then the FFs 7-1, 7-2 are reset. As a result, the selector 5-1 selects the modulating signal (the input data) that has not passed through the delay element 6-1 and the selector 5-0 selects the output of the selector 5-1. Hence the phase of the modulating signal output by the selector 5-0 is advanced, by an amount equivalent to the delay time of delay element 6-1, with respect to the phase of the modulating signal output by delay element 6-0, and therefore the rising edge of the pulse EP for driving the semiconductor laser output by the OR gate 4 occurs earlier. The pulse width of the signal, therefore, is enlarged.

(b-3) Second Modification

Figure 9:
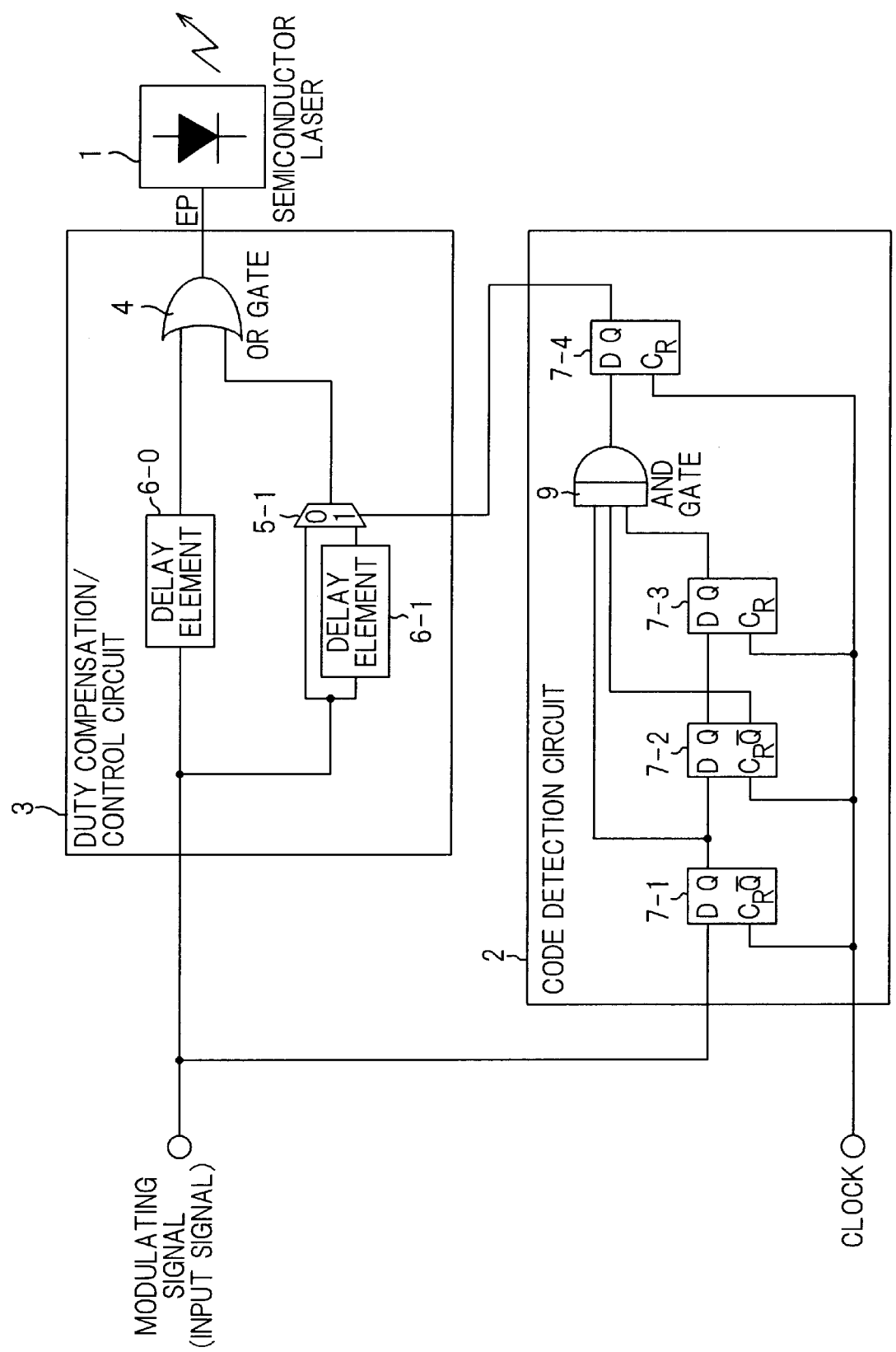
FIG. 9 is a diagram showing another modification of the first embodiment.
Figure 10:
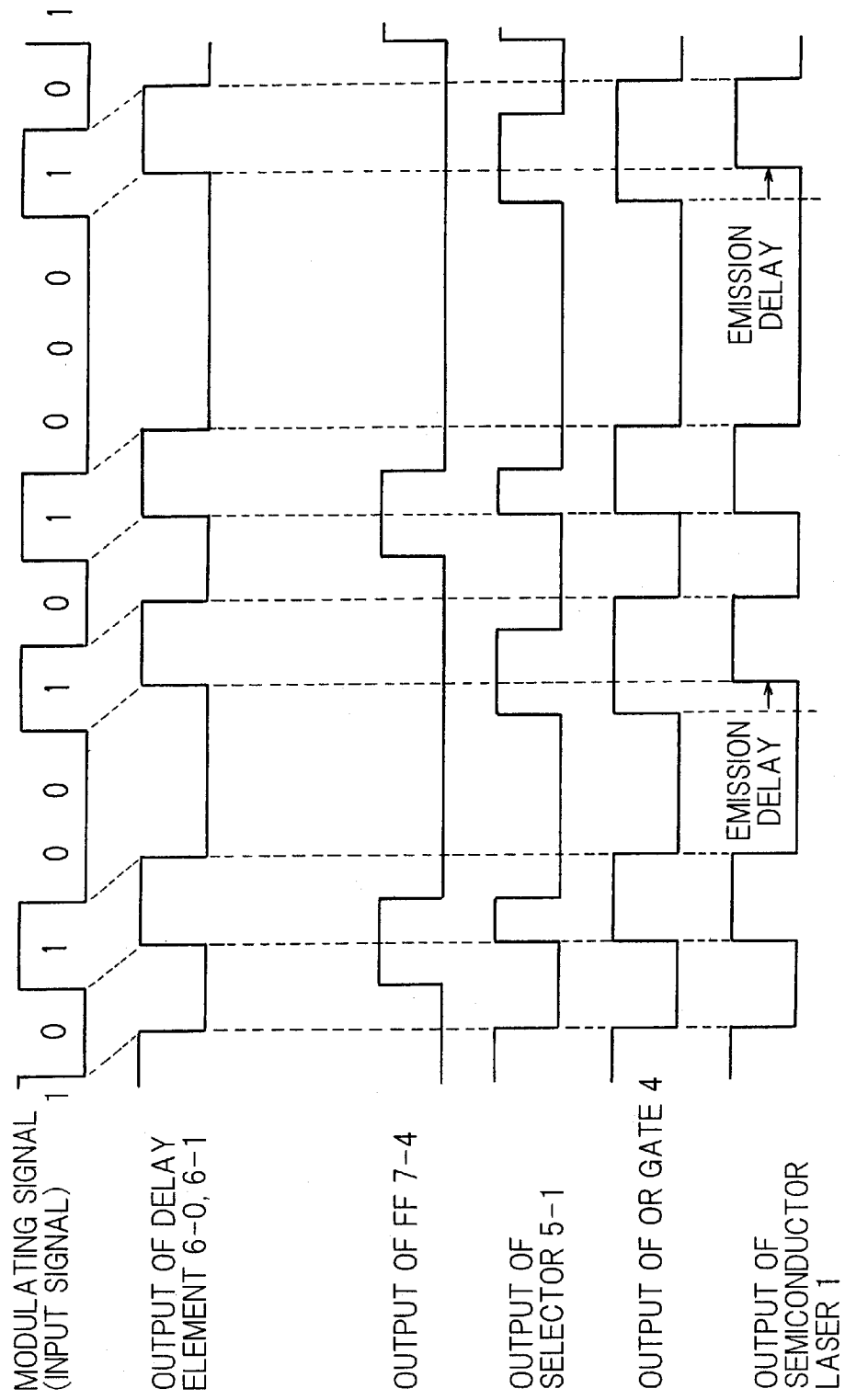
FIG. 10 is a timing chart of various signals associated with the modification of FIG. 9.

FIG. 9 is a diagram showing another modification (where N=2) of the first embodiment, and FIG. 10 is a timing chart of various signals associated with this modification. Components in FIG. 9 identical with those shown in FIG. 4 are designated by like reference characters. Numeral 9 denotes the AND gate.

According to this modification, whether a "101" pattern in the input modulating signal has entered as an input is discriminated. If the "101" pattern has entered, the pulse width of the pulse signal EP is reduced by reason of the fact that the number of successive "0" s preceding the "1" is one or less. The semiconductor laser driver circuit outputs the pulse signal EP when the input data is a "1". The circuit controls the rising edge and pulse width of the pulse signal EP in accordance with the number of successive "0" s preceding the "1". Since the semiconductor laser 1 is driven continuously if "1" s succeed one another, it is unnecessary to consider controlling the rising edge and pulse width of the driving pulses in regard to the second "1" onward.

Accordingly, even if the current bit is a "1", no consideration is needed so long as the preceding bit is a "1". The leading edge and pulse width of the driving pulse signal EP should be controlled taking into account only a case where the current bit is a "1" and the preceding bit is a "0". On the basis of these two bits alone, however, it cannot be determined whether the number of successive "0"s preceding the "1" is one or less or two or greater, and therefore the "1", "0" logic of the bit preceding these two bits needs to be considered. In other words, in the case of a three-bit pattern "101" inclusive of the current "1" bit, it is possible to judge that the number of successive "0" s preceding the "1" is one or less, and in the case of a three-bit pattern "001" inclusive of the current "1" bit, it is possible to judge that the number of successive "0"s preceding the "1" is two or more. Accordingly, control should be performed so as to delay the rising edge and reduce the pulse width of the laser driving pulse EP, which corresponds to the current "1" bit in the "101" pattern, only when the "101" pattern has been detected.

Thus, if the "101" pattern appears in the input modulating signal in the modification of FIG. 9, the Q output of the FF 7-1, the inverted Q output of the FF 7-2 and the Q output of the FF 7-3 of the code detection circuit 2 all become logical "1" ; the output of the AND gate 9 becomes logical "1" at this time only. Detecting the "101" pattern is equivalent to detecting the case where the number of successive "0" s preceding the "1" is one or less, as described above.

When the "101" pattern is detected and the output of the AND gate 9 becomes logical "1", the FF 7-4 is set. As a result, the selector 5-1 selects the —modulating signal that has passed through the delay element 6-1. The phase of the modulating signal output by the selector 5-1 becomes the same as that of the modulating signal output by the delay element 6-0 and the pulse width of the pulse EP for driving the semiconductor laser is not enlarged. However, in case of a pattern other than the "101" pattern, i.e., a "001" pattern, the output of the AND gate 9 becomes "0" and the FF 7-4 is not set. As a result, the selector 5-1 selects the modulating signal (the input data) that has not passed through the delay element 6-1. Hence the phase of the modulating signal output by the selector 5-1 is advanced, by an amount equivalent to the delay time of delay element 6-1, with respect to the phase of the modulating signal output by delay element 6-0, and therefore the rising edge of the pulse EP for driving the semiconductor laser output by the OR gate 4 occurs earlier and the pulse width is enlarged.

More specifically, the pulse width of the laser driving pulse signal EP is reduced when the number of successive "0"s is one or less and is enlarged when the number of successive "0"s is two or more, thereby making it possible to suppress pattern jitter.

Thus, when the "101" pattern has been detected in the code detection circuit 2, control is performed so as to delay the rising edge and reduce the pulse width of the laser driving pulse EP that corresponds to the current "1" in the "101" pattern. However, it is also possible to detect the pattern "001" of three successive bits in the code detection circuit 2 and perform control so as to advance the rising edge and enlarge the pulse width of the laser driving pulse EP that corresponds to the current "1".

(c) Second Embodiment

Figure 11:
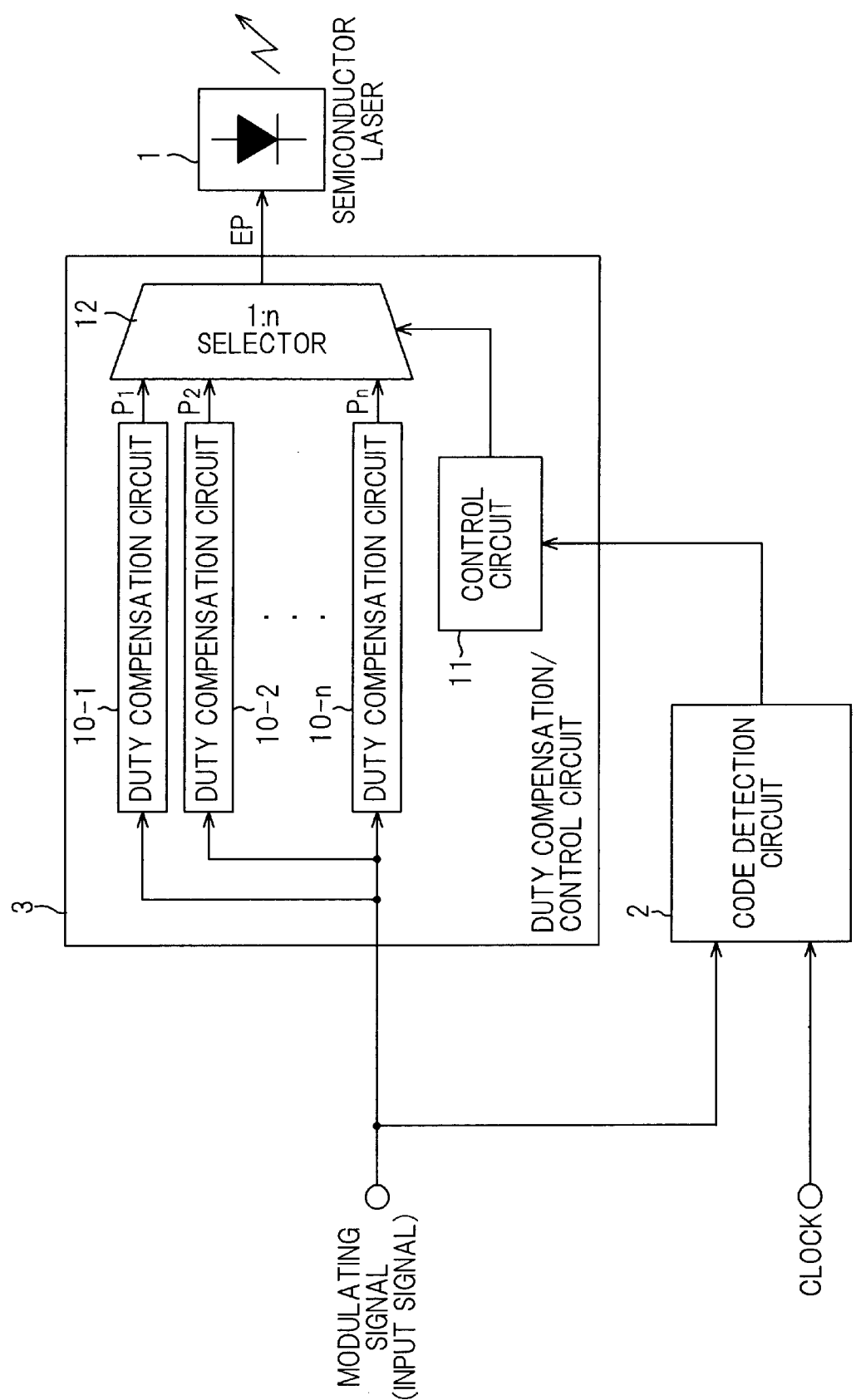
FIG. 11 is a diagram showing the construction of a second embodiment of a semiconductor laser driver circuit according to the present invention.
Figure 12:
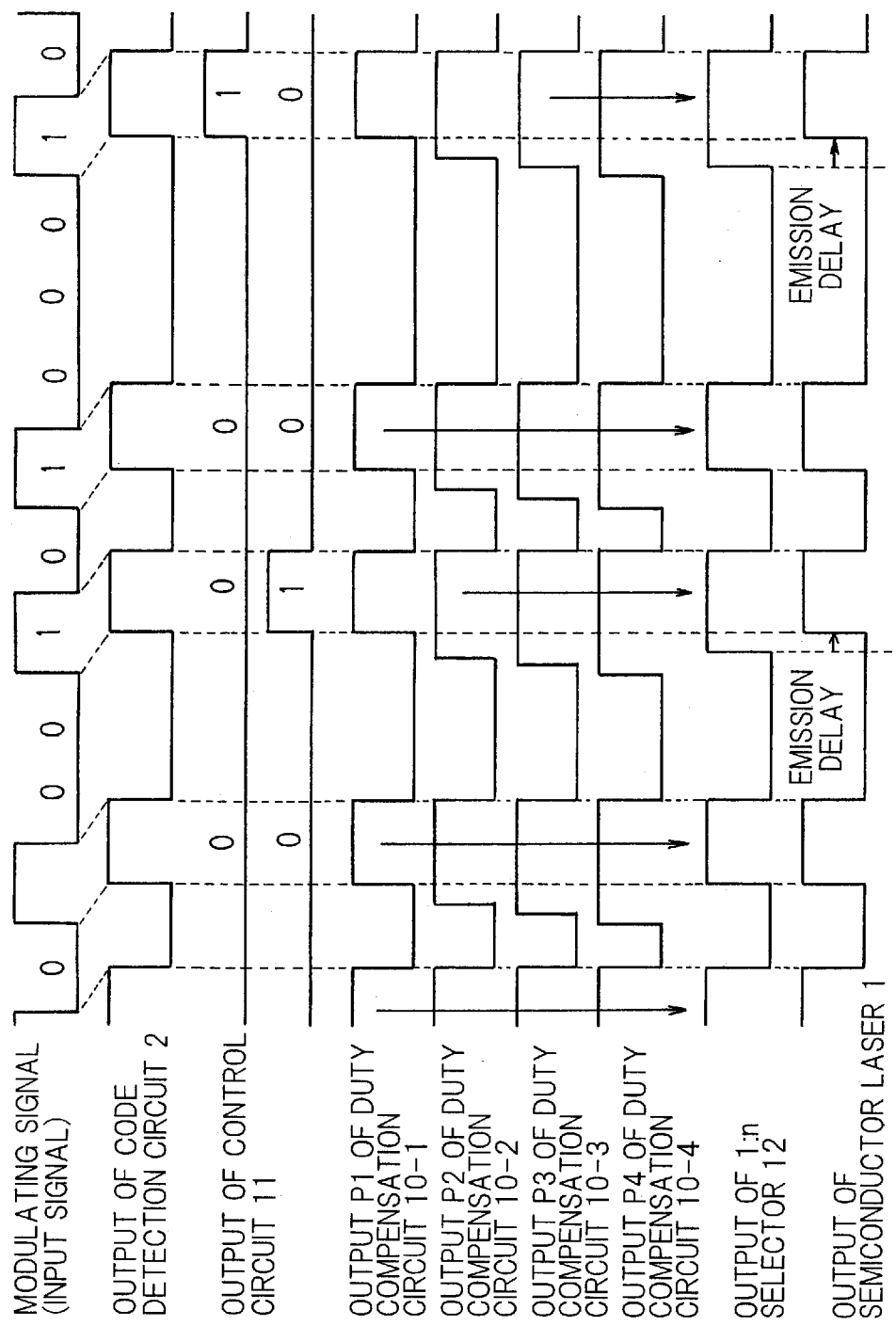
FIG. 12 is a timing chart of various signals associated with the second embodiment.

FIG. 11 is a diagram showing the construction of a second embodiment of a semiconductor laser driver circuit according to the present invention, and FIG. 12 is a timing chart according to the second embodiment.

Shown in FIG. 11 are the semiconductor laser 1 the code detection circuit 2 for detecting the code of the input data, and the duty compensation/control circuit 3 (pulse-width adjustment circuit) for adjusting and outputting, on the basis of the detected code, the pulse width of the pulse EP that drives the semiconductor laser 1. The code detection circuit 2 has a construction the same as that illustrated in the first embodiment of FIG. 4. In the second embodiment, the duty compensation/control circuit 3 includes duty compensation circuits 10-1 through 10-n. When "1" data is input to these duty compensation circuits, the circuits output pulse signals $P_1$–$P_n$ having duties, i.e., pulse widths, that differ from one another, as shown in FIG. 12. A control circuit 11 discriminates the number of successive "0"s preceding a "1" on the basis of the states of the FFs 7-1 through 7-n in the code detection circuit 2 and outputs a duty selection signal conforming to the number of successive "0"s. A selector 12 selects a pulse output from a prescribed one of the duty compensation circuits 10-1 through 10-n and inputs the pulse to the semiconductor laser 1. The selector 12 (1) selects a pulse signal $P_1$ of minimum duty, which is output by the duty compensation circuit 10-1, when the number of successive "0"s preceding a "1" is one or less; (2) selects a pulse signal $P_2$, which is output by the duty compensation circuit 10-2, when the number of successive "0"s preceding a "1" is two; and (3) in similar fashion, selects a pulse signal $P_n$, which is output by the duty compensation circuit 10-n, when the number of successive "0"s preceding a "1" is n. The pulse selected is input to the semiconductor laser 1.

Thus, according to the second embodiment, the pulse signal EP for driving the semiconductor laser by a "1" immediately following successive "0"s is selected and output, by the selector 12, from whichever of the duty compensation circuits 10-1 through 10-n corresponds to the number of successive "0"s. As a result, the semiconductor laser 1 can be driven by a driving pulse signal EP having a pulse width that conforms to the number of successive "0"s.

Figure 13:
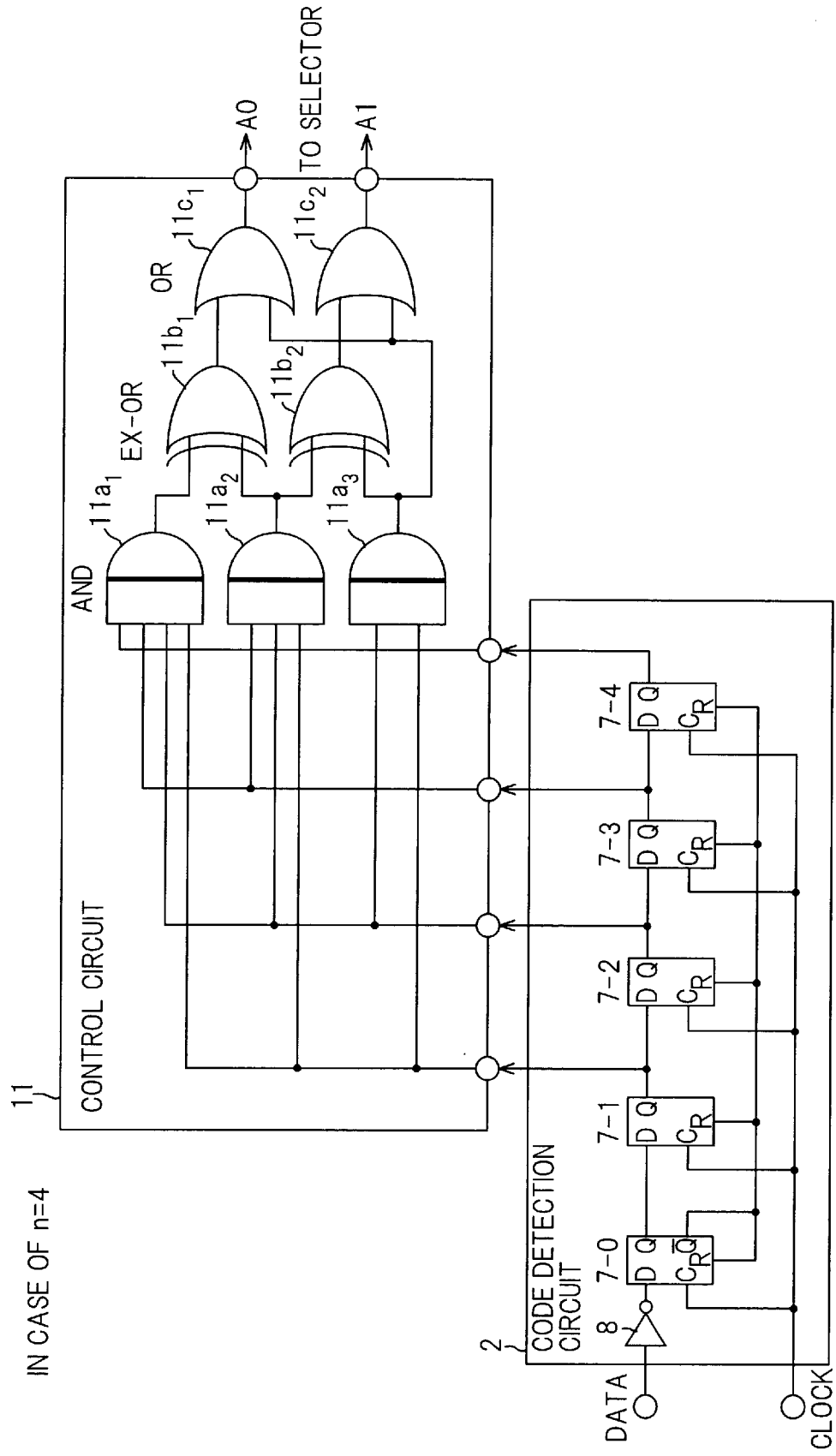
FIG. 13 is a diagram showing the construction of a control circuit.

FIG. 13 is a diagram showing the construction of the control circuit 11. Here n=4 holds. The control circuit 11 includes AND gates $11a_1$–$11a_3$, EX-OR gates $11b_1$, $11b_2$ and OR gates $11c_1$, $11c_2$, which output signals A0, A1, respectively. The output signals (A0, A1) take on the following values:

(1) (0,0) if the number of successive "0"s is one or less;
(2) (0,1) if the number of successive "0"s is two;
(3) (1,0) if the number of successive "0"s is three; and
(4) (1,1) if the number of successive "0"s is four.

(d) Third Embodiment

According to the first embodiment, the modulating signal (input data) is delayed based upon the number of successive "0"s preceding a "1", and the rising edge and pulse width of the pulse signal for driving the semiconductor laser are controlled using the delayed signal. In a third embodiment, however, the rising edge and pulse width of the laser driving pulse signal are controlled upon delaying a clock signal.

Figure 14:
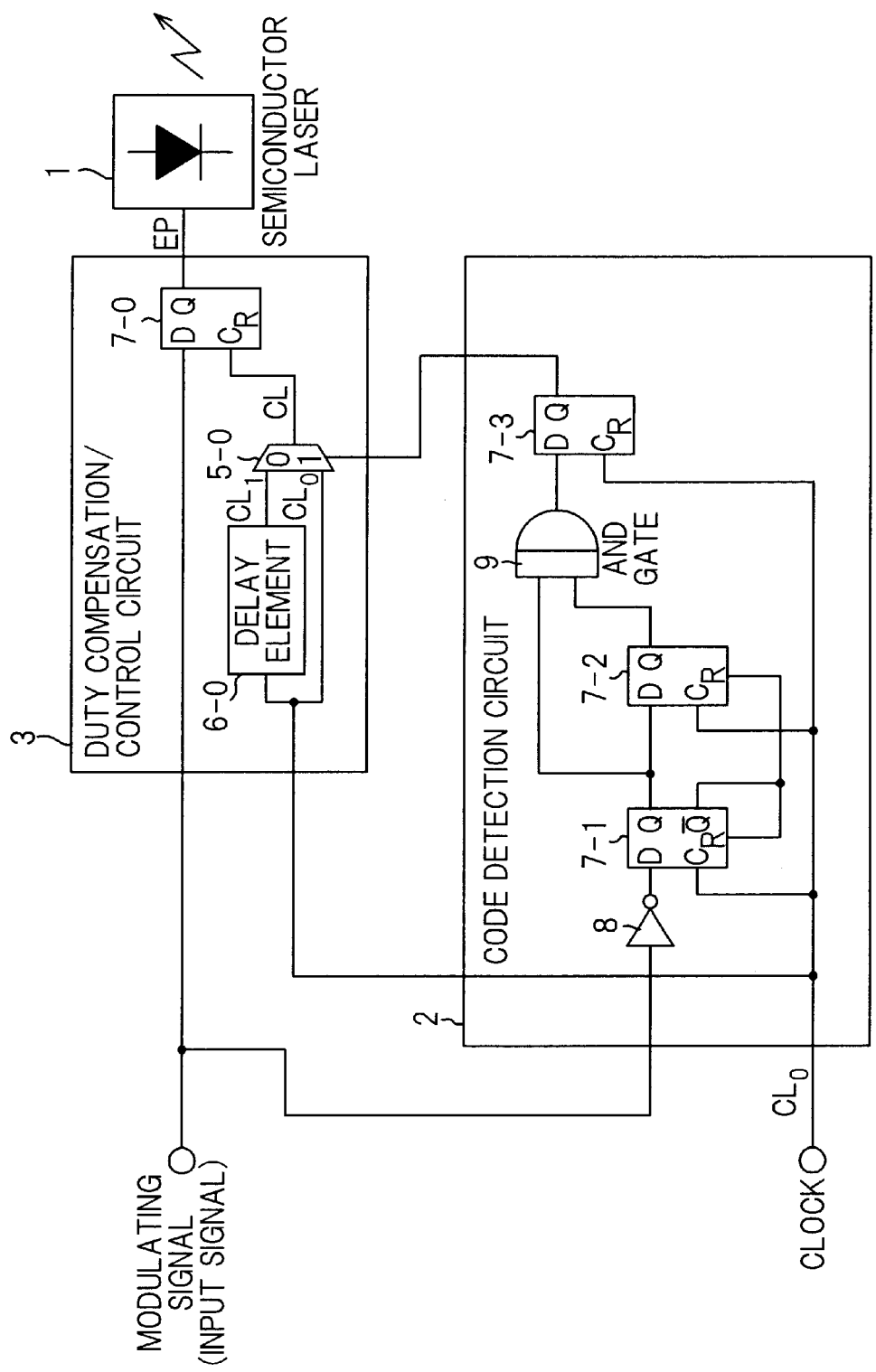
FIG. 14 is a diagram showing the construction of a third embodiment of a semiconductor laser driver circuit according to the present invention.
Figure 15:
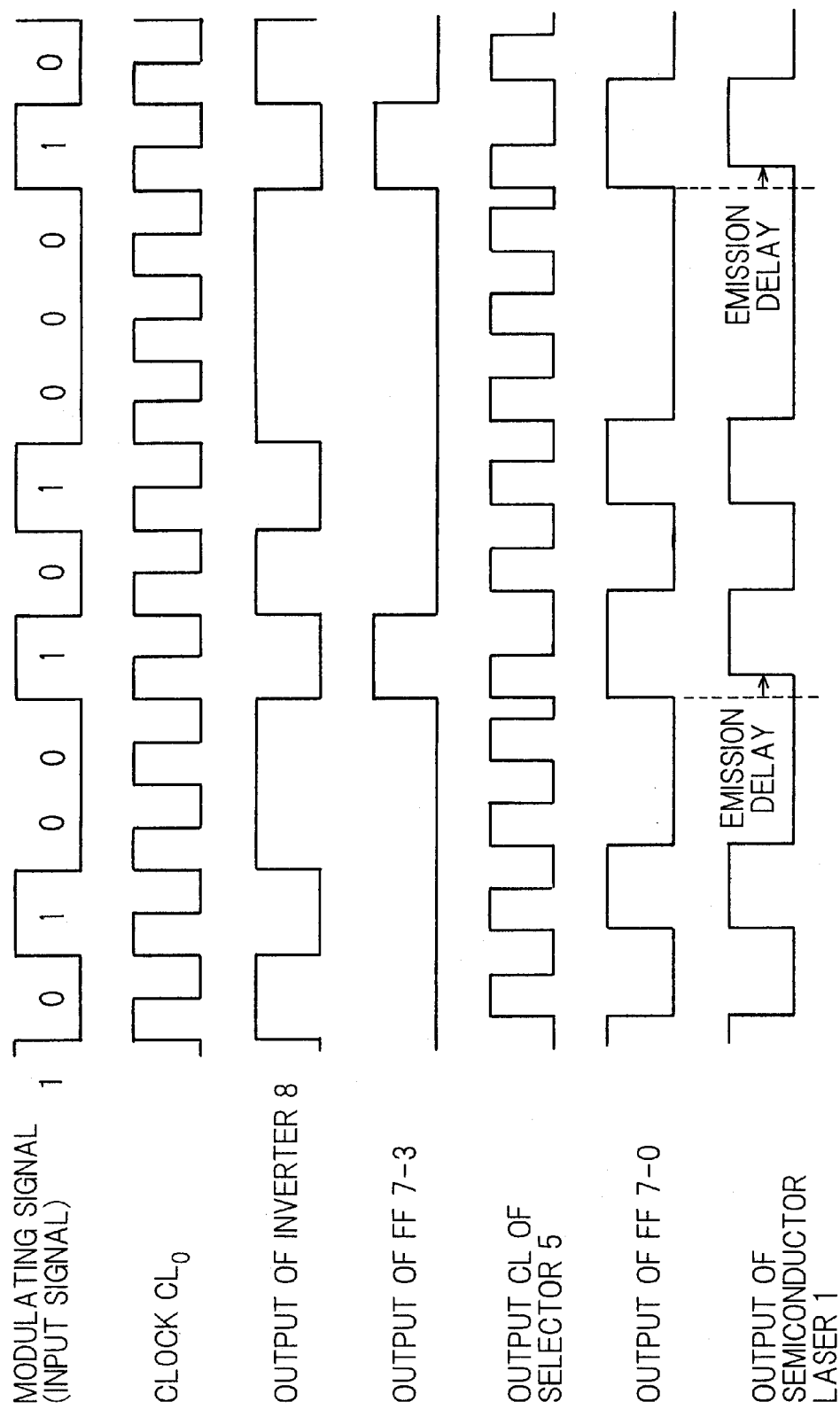
FIG. 15 is a timing chart of various signals associated with the third embodiment.

FIG. 14 is a diagram showing the construction of a third embodiment of a semiconductor laser driver circuit according to the present invention, and FIG. 15 is a timing chart according to the third embodiment. This illustrates a case where the rising edge and pulse width of the laser driving pulse signal EP are controlled in dependence upon whether the number of successive "0"s is one or less or two or greater.

Shown in FIG. 14 are the semiconductor laser 1 the code detection circuit 2 for detecting the code of the input data, and the duty compensation/control circuit 3 (pulse-width adjustment circuit) for adjusting and outputting, on the basis of the detected code, the pulse width of the pulse EP that drives the semiconductor laser 1.

The code detection circuit 2 is so adapted as to detect a case where the number of successive "0"s preceding a "1" is one or less and a case where the number of successive "0"s preceding a "1" is two or greater. The code detection circuit 2 has a construction the same as that illustrated in FIG. 7. The duty compensation/control circuit 3 has a delay element 6-0 for delaying, by a predetermined length of time, a clock signal having a frequency identical with the bit rate of the data, a selector 5-0 and a flip-flop 7-0. The selector 5-0 selects and outputs a delayed clock signal $CL_1$, which has been delayed by the delay element 6-0, if the number of successive "0"s preceding a "1" is one or less, and selects and outputs the original clock signal $CL_0$, which has not been delayed, if the number of successive "0"s is two or greater. The FF 7-0 stores the input data on the basis of the clock signal CL output by the selector 5-0.

The modulating signal (input data) input to the code detection circuit 2 is inverted by the inverter 8. If the number of successive "0"s is two or greater, the Q outputs of the FFS 7-1, 7-2 both become logical "1". In this case only, therefore, the output of the AND gate 9 is logical "1". If the number of successive "0"s is one or less, on the other hand, the output of the AND gate 9 is logical "0". More specifically, in a case where the number of successive "0"s is one or less, the output of the AND gate 9 does not go to logical "1" and the Q output of FF 7-3 becomes logical "0". Consequently, the selector 5-0 selects the delayed clock $CL_1$ that has passed through the delay element 6-0, and the FF 7-0 sets input data in response to the delayed clock signal. As a result, the rising edge of the pulse EP for driving the semiconductor laser is delayed and the pulse width is not enlarged.

In a case where the number of successive "0"s preceding a "1" is two or greater, however, the output of the AND gate 9 becomes logical "1", the FF 7-3 is set the next time a "1" enters and then the FFs 7-1, 7-2 are reset. As a result, the selector 5-0 selects the undelayed original clock signal $CL_0$ that has not passed through the delay element 6-0 and the FF 7-n sets the input data in response to the original clock signal. The rising edge of the pulse EP for driving the semiconductor laser, therefore, is not delayed. That is, the rising edge of the laser driving pulse EP is made earlier and the pulse width is enlarged more than in the case where the number of successive "0"s is one or less. As a result, the duty of the light output waveform in a case where the number of successive "0"s preceding a "1" is two or greater is adjusted for compensation to make possible the elimination of pattern jitter.

First Modification

In the third embodiment, there are two cases, namely a case where the number n of successive "0"s preceding a "1" is one or less and a case where the number n of successive "0"s preceding a "1" is two or greater. In general, however, the rise time and pulse width of the laser driving pulse EP can be controlled based upon the value of n, namely the number of successive "0"s. In such case control is performed so as to generate a plurality of clock signals having different delay times, select a clock signal wherein the larger the number of successive "0"s, the shorter the delay time of the selected signal, and latch the input data in response to the selected clock signal, thereby advancing the rising edge and enlarging the pulse width of the laser driving pulse EP.

Second Modification

In this modification, whether the "001" pattern of the input modulating signal has entered is discriminated. If it is determined that this pattern has entered, the pulse width of the laser driving pulse EP is enlarged by the method of the third embodiment in FIG. 14 by reason of the fact that the number of successive "0"s is two or greater.

Figure 16:
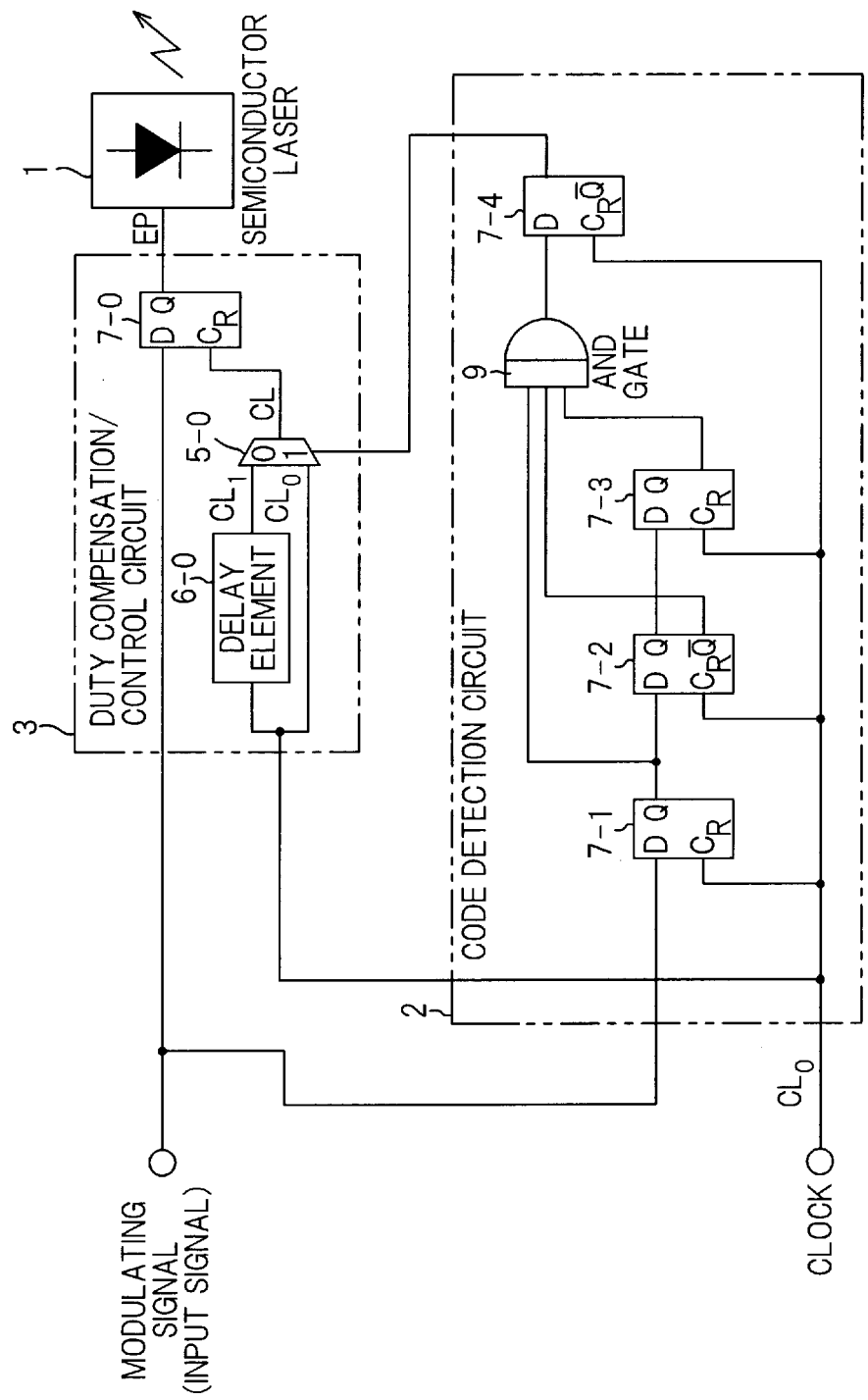
FIG. 16 is a diagram showing a modification of the third embodiment.
Figure 17:
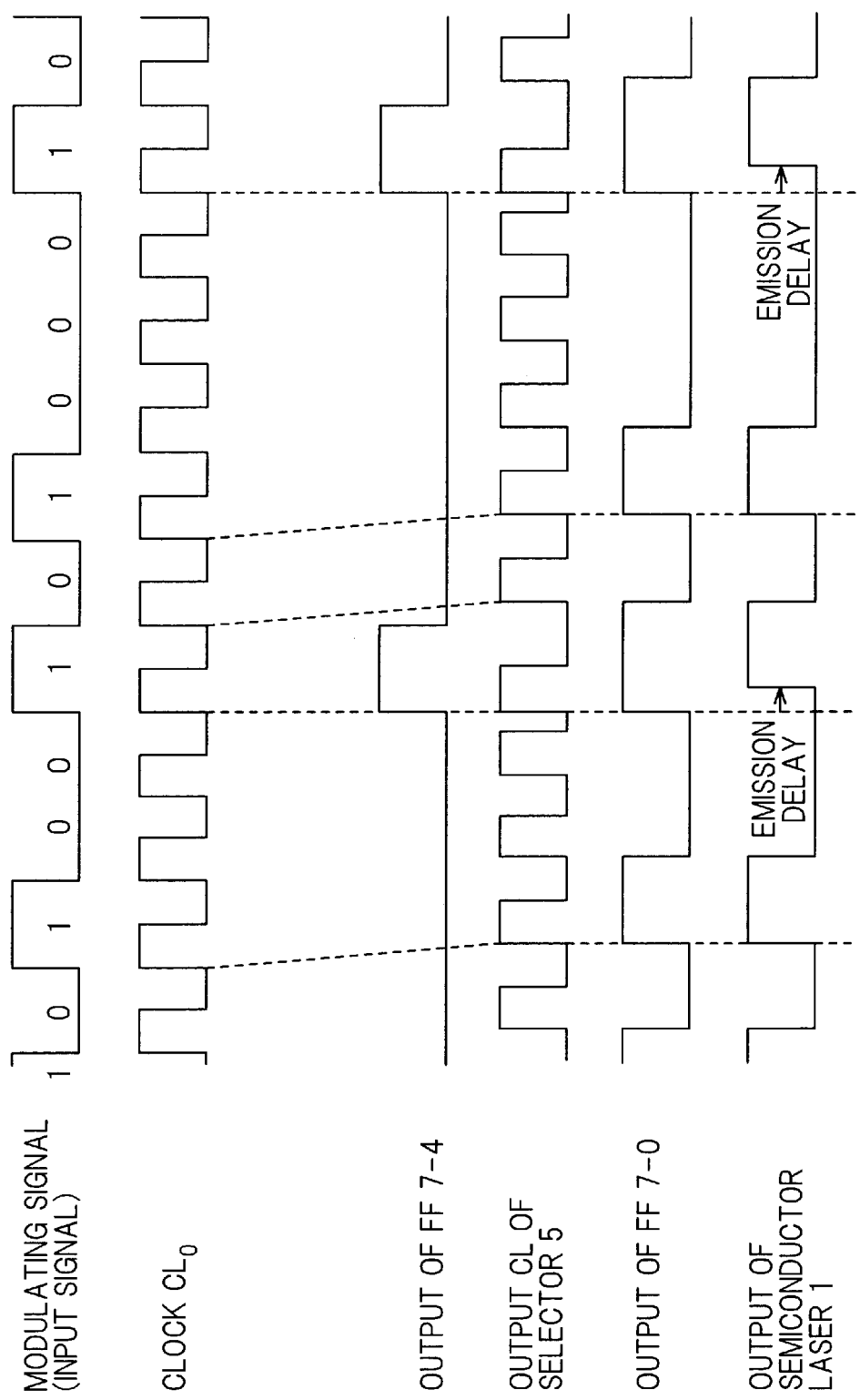
FIG. 17 is a timing chart of various signals associated with the modification of FIG. 16.

FIG. 16 is a diagram showing the construction of the semiconductor laser driver circuit according to the second modification, and FIG. 17 is a timing chart according to the second modification.

If the input modulating signal has a "001" pattern, the Q output of the FF 7-1, the inverted Q output of the FF 7-2 and the inverted Q output of the FF 7-3 in the code detection circuit 2 all become logical "1", and the output of the AND gate 9 becomes logical "1" at this time only. Detecting the "001" pattern is equivalent to detecting the case where the number of successive "0"s preceding a "1" is two or greater. When the "001" pattern is detected and the output of the AND gate 9 becomes logical "1", the FF 7-4 is set. As a result, the selector 5-0 selects the undelayed original clock signal $CL_0$ that has not passed through the delay element 6-0 and the FF 7-0 sets the input data in response to the original clock signal. The rising edge of the pulse EP for driving the semiconductor laser, therefore, is not delayed. That is, the rising edge of the laser driving pulse EP is made earlier and the pulse width is enlarged more than in the case where the number of successive "0"s is one or less. As a result, the duty of the light output waveform in a case where the number of successive "0"s preceding a "1" is two or greater is adjusted for compensation to make possible the elimination of pattern jitter.

(e) Fourth Embodiment

According to the first embodiment, the modulating signal (input data) is delayed based upon the number of successive "0"s preceding a "1" and the rising edge and pulse width of the laser driving pulse EP are controlled using the delayed signal. According to the fourth embodiment, however, the rising and falling edges of the input data waveform are slanted or rounded to obtain slanted or rounded signals, the discrimination level is controlled based upon the number of successive "0"s, the discrimination level is compared with the slanted or rounded signals, a slanted or rounded signal above the discrimination level is amplified and output, and the rising edge and pulse width of the laser driving pulse EP are controlled based upon the number of successive "0"s preceding a "1".

Figure 18:
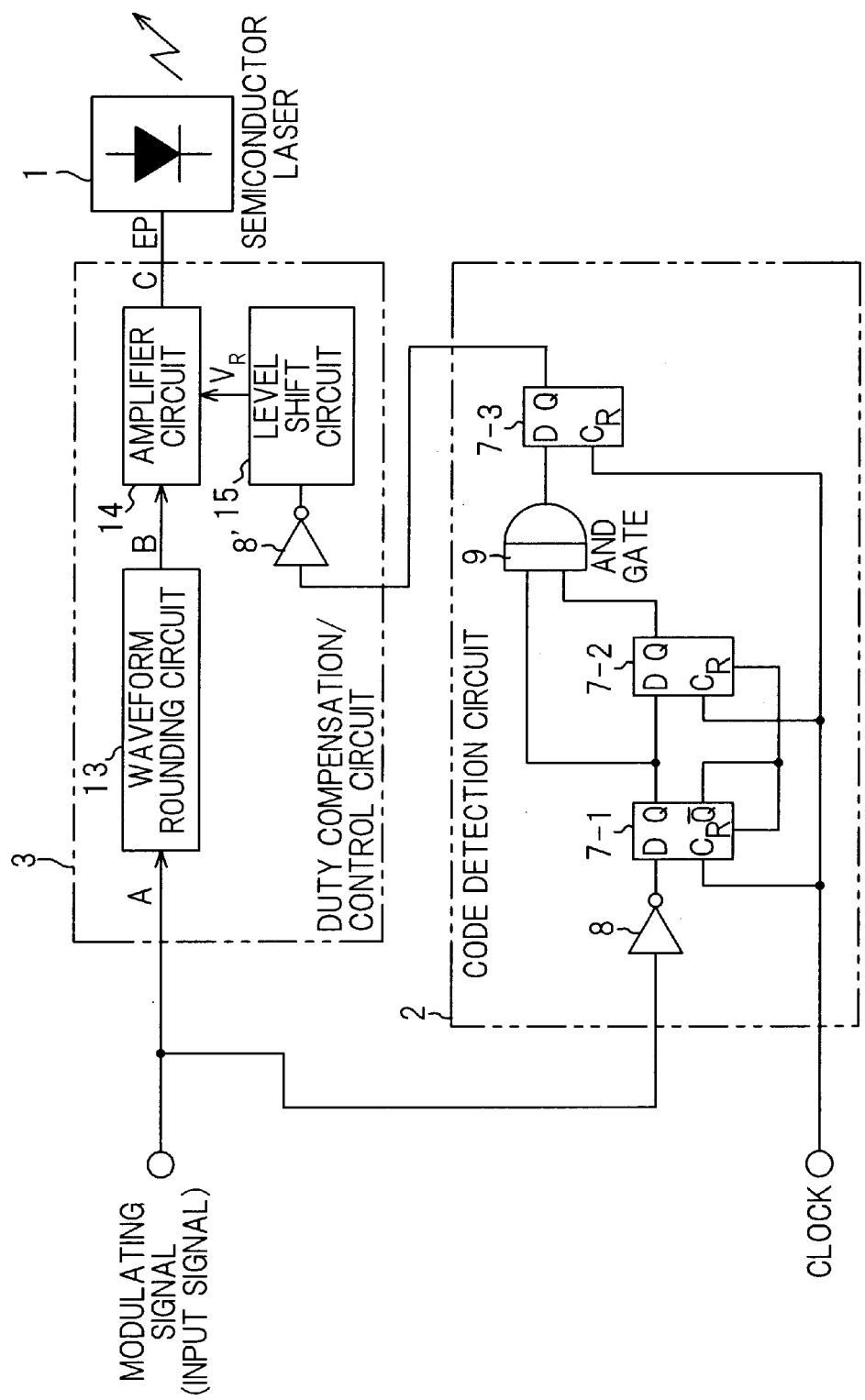
FIG. 18 is a diagram showing the construction of a fourth embodiment of a semiconductor laser driver circuit according to the present invention.
Figure 19:
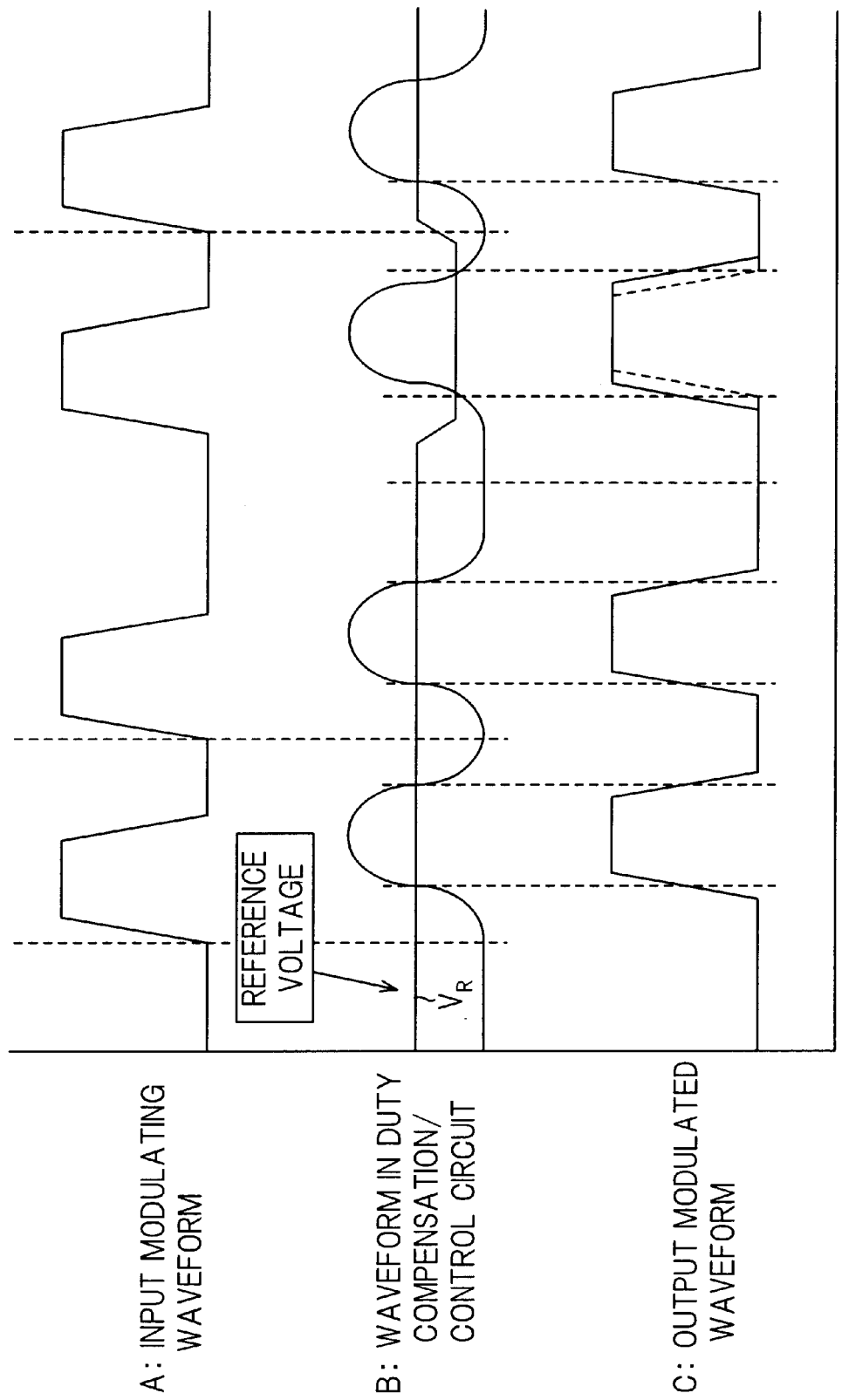
FIG. 19 is a timing chart of various signals associated with the fourth embodiment.

FIG. 18 is a diagram showing the construction of a fourth embodiment of a semiconductor laser driver circuit according to the present invention, and FIG. 19 is a timing chart according to the fourth embodiment. This illustrates a case where the rising edge and pulse width of the laser driving pulse signal EP are controlled in dependence upon whether the number of successive "0"s is one or less or two or greater.

Shown in FIG. 18 are the semiconductor laser 1 the code detection circuit 2 for detecting the code of the input data, and the duty compensation/control circuit 3 (pulse-width adjustment circuit) for adjusting and outputting, on the basis of the detected code, the pulse width of the pulse EP that drives the semiconductor laser 1.

The code detection circuit 2 is so adapted as to detect a case where the number of successive "0"s preceding a "1" is one or less and a case where the number of successive "0"s preceding a "1" is two or greater. The code detection circuit 2 has a construction the same as that illustrated in FIG. 7. The duty compensation/control circuit 3 has an inverter circuit 8'; a waveform rounding circuit 13, which is constituted by e.g. a low-pass filter or the like, for outputting a rounded signal B obtained by slanting or rounding the rising and falling edges of the input signal A (see FIG. 19); a differential amplifier circuit 14 for comparing a discrimination level $V_R$ with the rounding signal B output by the waveform rounding circuit 13 and amplifying a rounded signal that is above the discrimination level, thereby outputting a signal C, namely the pulse EP for driving the semiconductor laser; and a level shift circuit 15 for lowering the discrimination level $V_R$ when the number of successive "0"s preceding a "1" is two or greater, thereby advancing the leading edge and enlarging the pulse width of the pulse EP.

The modulating signal (input data) input to the code detection circuit 2 is inverted by the inverter 8. If the number of successive "0"s is two or greater, the Q outputs of the FFs 7-1, 7-2 both become logical "1". In this case only, therefore, the output of the AND gate 9 is logical "1". If the number of successive "0"s is one bit or less, on the other hand, the output of the AND gate 9 is logical "0".

Accordingly, in a case where the number of successive "0"s is one or less, the output of the AND gate 9 does not go to logical "1" and the Q output of FF 7-3 becomes logical "0". The level shift circuit 15, therefore, cannot change the level. As a result, the pulse width of the pulse EP output by the differential amplifier circuit 14 is not enlarged. In a case where the number of successive "0"s preceding a "1" is two or greater, however, the output of the AND gate 9 becomes logical "1", the FF 7-3 is set the next time a "1" enters and then the FFs 7-1, 7-2 are reset. As a result, the level shift circuit 15 lowers the discrimination level $V_R$, whereby the driving pulse output by the differential amplifier circuit 14 has its leading edge advanced and its width enlarged.

First Modification

Figure 20:
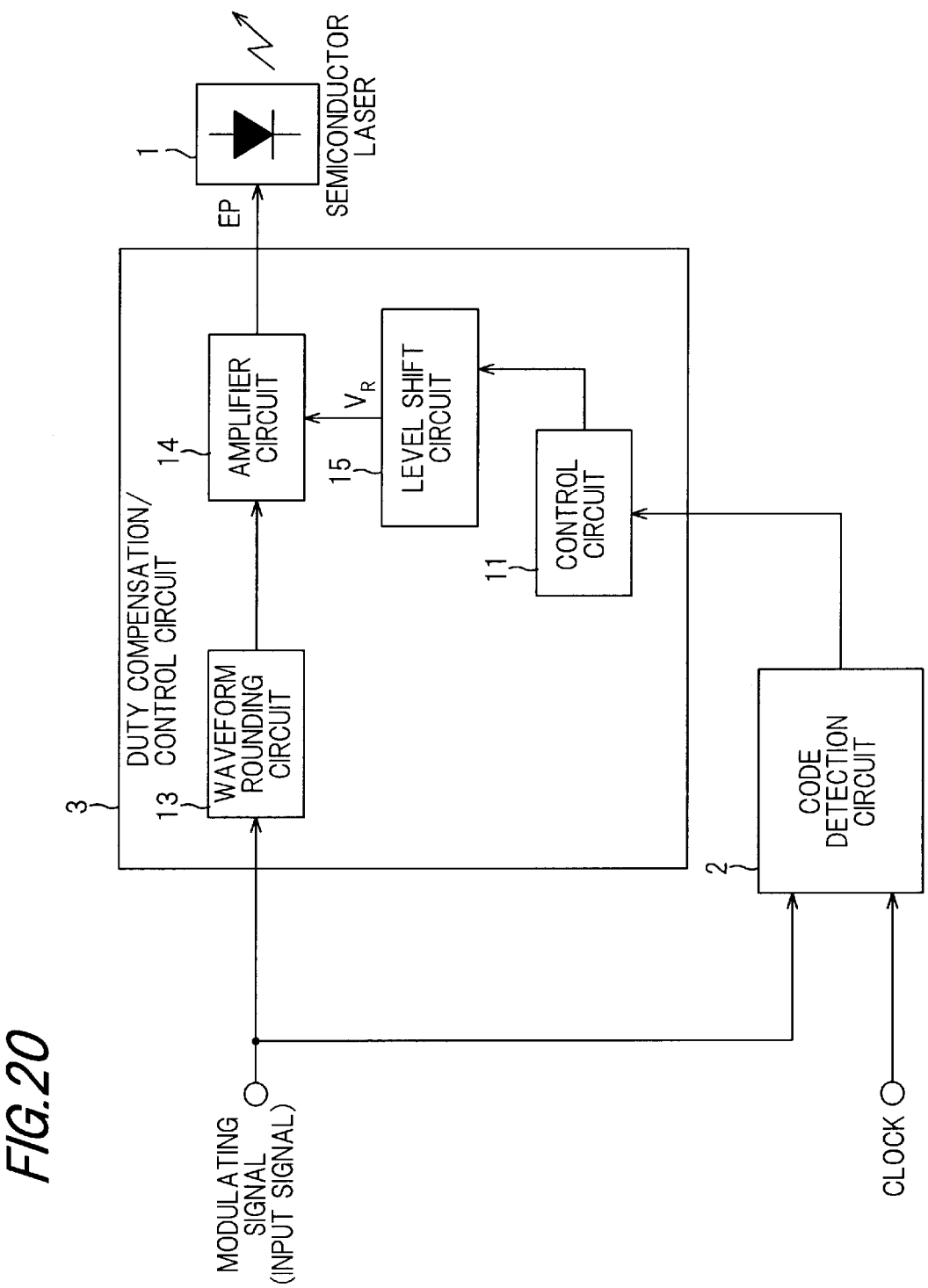
FIG. 20 is a diagram showing a modification of the fourth embodiment.

According to the fourth embodiment, there are two cases, namely a case where the number n of successive "0"s preceding a "1" is one or less and a case where the number n of successive "0"s preceding a "1" is two or greater. In general, however, the rise time and pulse width of the laser driving pulse EP can be controlled based upon the value of n, namely the number of successive "0"s. FIG. 20 is a diagram showing the construction of the apparatus in such case. Shown in FIG. 20 are the semiconductor laser 1 the code detection circuit 2 for detecting the code of the input data, this circuit having a construction the same as that of the code detection circuit shown in FIG. 4, and the duty compensation/control circuit 3 (pulse-width adjustment circuit) for adjusting and outputting, on the basis of the detected code, the pulse width of the pulse EP that drives the semiconductor laser 1.

Figure 21:
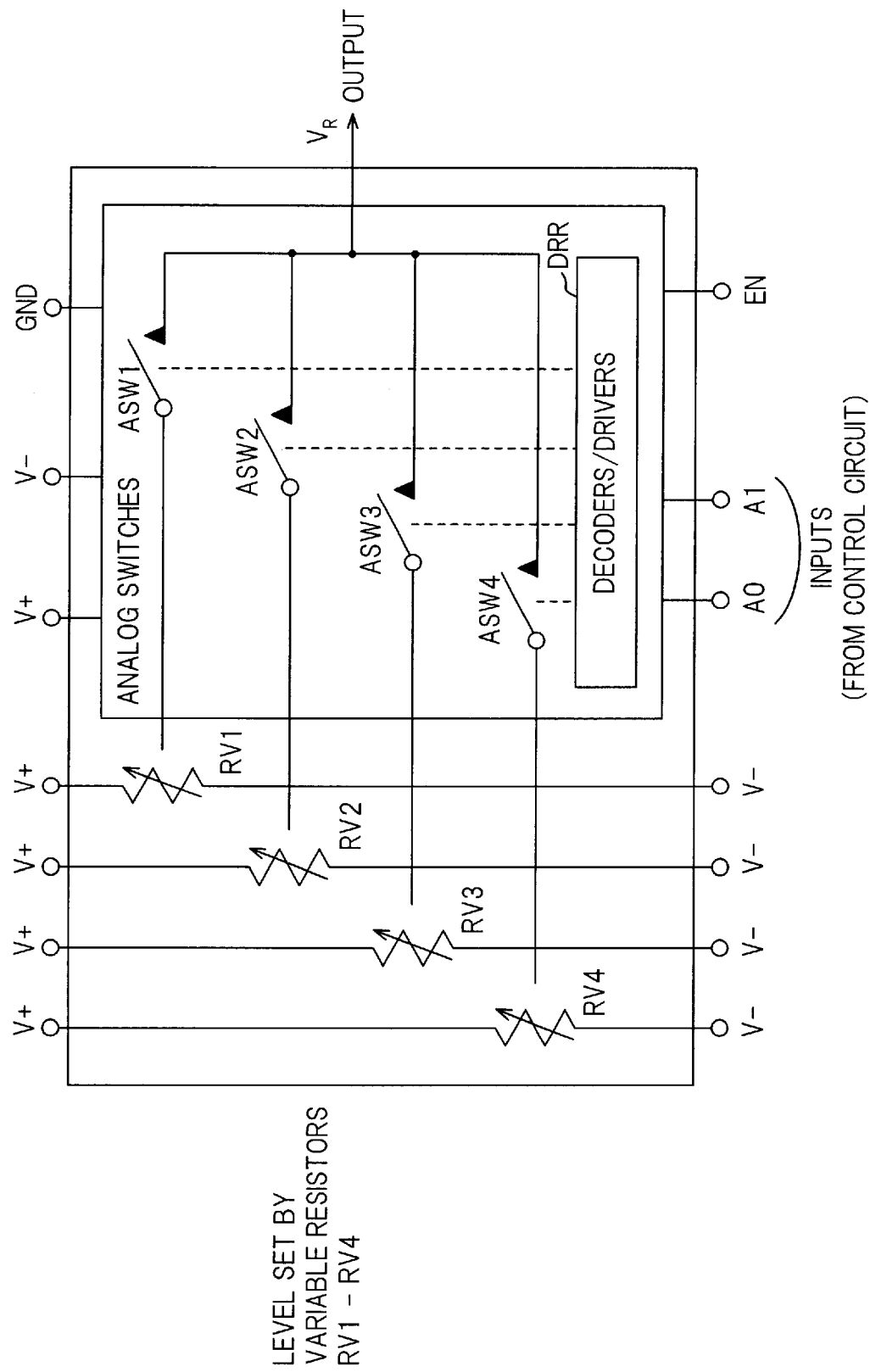
FIG. 21 is a diagram showing the construction of a level shift circuit in which level can be changed in four stages.
Figure 22:
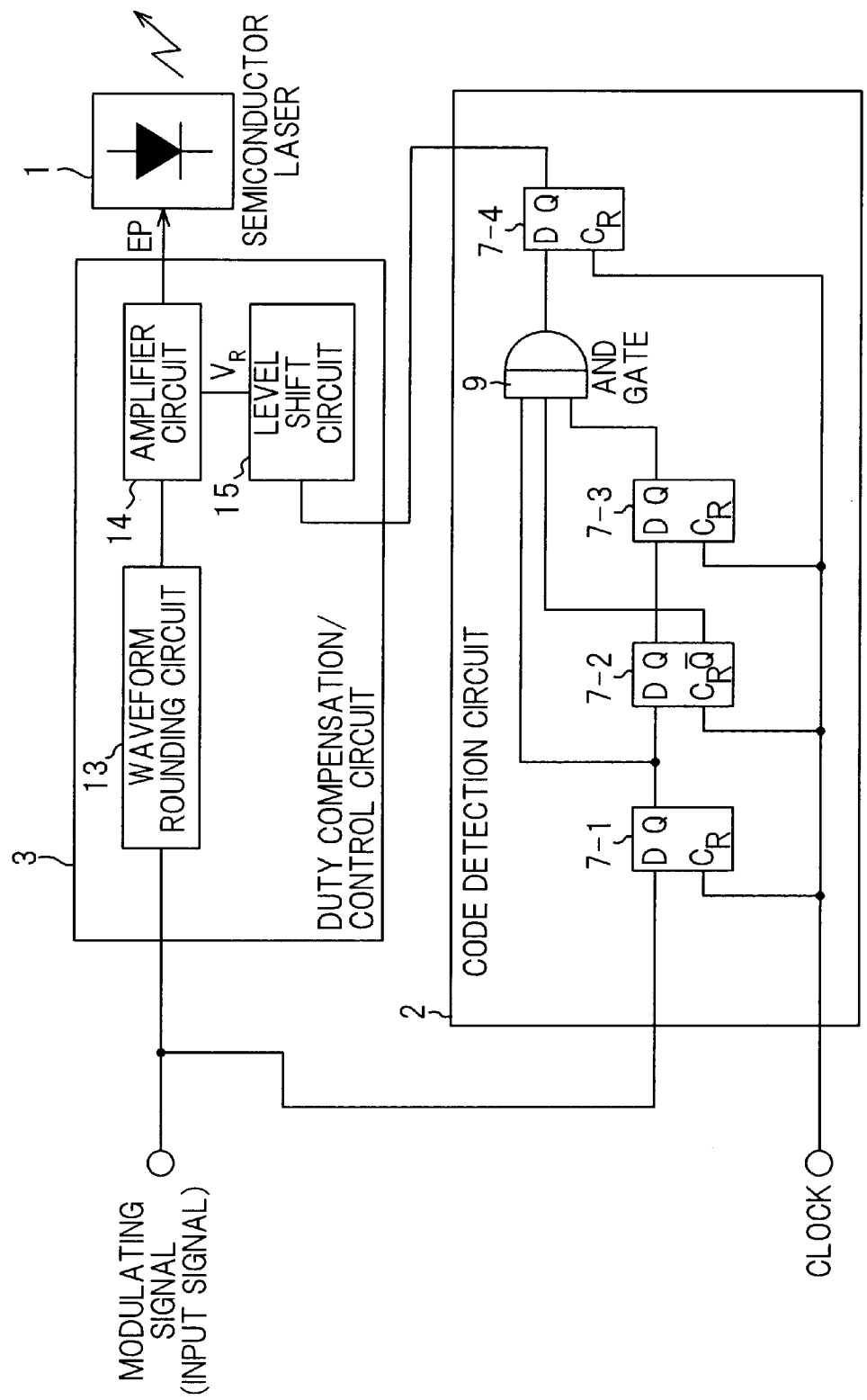
FIG. 22 is a diagram showing another modification of the fourth embodiment.

The duty compensation/control circuit 3 includes the control circuit 11, the waveform rounding circuit 13, the differential amplifier circuit 14 and the shift circuit 15. The control circuit 11 discriminates the number of successive "0"s preceding a "1" and outputs a level selection signal conforming to the number of successive "0"s. In a case where n=4 holds, the control circuit 11 has the construction shown in FIG. 13. The shift circuit 15 outputs a level conforming to the number of successive "0"s preceding a "1". In a case where n=4 holds, the level $V_R$ is output in four stages, as shown in FIG. 21. Here the shift circuit 15 includes a variable resistor RV1 for setting the level in a case where the number of successive "0"s is less than one, a variable resistor RV2 for setting the level in a case where the number of successive "0"s is two, a variable resistor RV3 for setting the level in a case where the number of successive "0"s is three, a variable resistor RV4 for setting the level in a case where the number of successive "0"s is four, analog switches ASW1–ASW4, and a decoder/driver DDR for turning on the analog switch that conforms to the number of successive "0"s, thereby outputting a prescribed level. For example, if number of successive "0"s is one or less, the decoder/driver DDR turns on the analog switch ASW1 to output the level set by the variable resistor RV1.

According to this modification, the larger the number of successive "0"s preceding a "1", the lower the discrimination level $V_R$ output by the shift circuit 15. The larger the number of successive "0"s, therefore, the more the rising edge of the laser driving pulse EP is advanced and the larger the pulse width can be made.

Second Modification

According to this modification, whether a "101" pattern in the input modulating signal has entered as an input is discriminated. If the "101" pattern has entered, the pulse width of the pulse signal EP is reduced by the method of the fourth embodiment by reason of the fact that the number of successive "0"s is one or less.

If the input modulating signal has a "101" pattern, the Q output of the FF 7-1, the inverted Q output of the FF 7-2 and the Q output of the FF 7-3 in the code detection circuit 2 all become logical "1", and the output of the AND gate 9 becomes logical "1" at this time only. Detecting the "101" pattern is equivalent to detecting the case where the number of successive "0"s preceding a "1" is one or less. When the "101" pattern is detected and the output of the AND gate 9 becomes logical "1", the FF 7-4 is set. When this occurs, the shift circuit 15 cannot change the level and, hence, the pulse width of the pulse EP output by the differential amplifier circuit 14 is not enlarged. However, in case of a pattern other than the "101" pattern, i.e., a "001" pattern, the output of the AND gate 9 becomes "0" and the FF 7-4 is not set. If the FF 7-4 is not set, the shift circuit 15 lowers the discrimination level $V_R$, thereby advancing the rising edge and enlarging the pulse width of the pulse EP output by the differential amplifier circuit 14. As a result, the duty of the light output waveform when the number of successive "0"s preceding a "1" is two or greater is adjusted for compensation to make possible the elimination of pattern jitter.

(f) Fifth Embodiment

According to the fourth embodiment, the rising and falling edges of the input data waveform are slanted or rounded to obtain slanted or rounded signals, the discrimination level is controlled based upon the number of successive "0"s, the discrimination level is compared with the slanted or rounded signals, a slanted or rounded signal above the discrimination level is amplified and output, and the rising edge and pulse width of the laser driving pulse EP are controlled based upon the number of successive "0" s preceding a "1".

According to a fifth embodiment, however, the level of voltage $V_R$ applied to a voltage-controlled-type delay line is controlled based upon the number of successive "0" s, the modulating signal (the input data) is delayed based upon the level and the delayed signal and modulating signal are combined, thereby controlling the leading edge and pulse width of the laser driving pulse EP based upon the number of successive "0" s preceding a "1".

Figure 23:
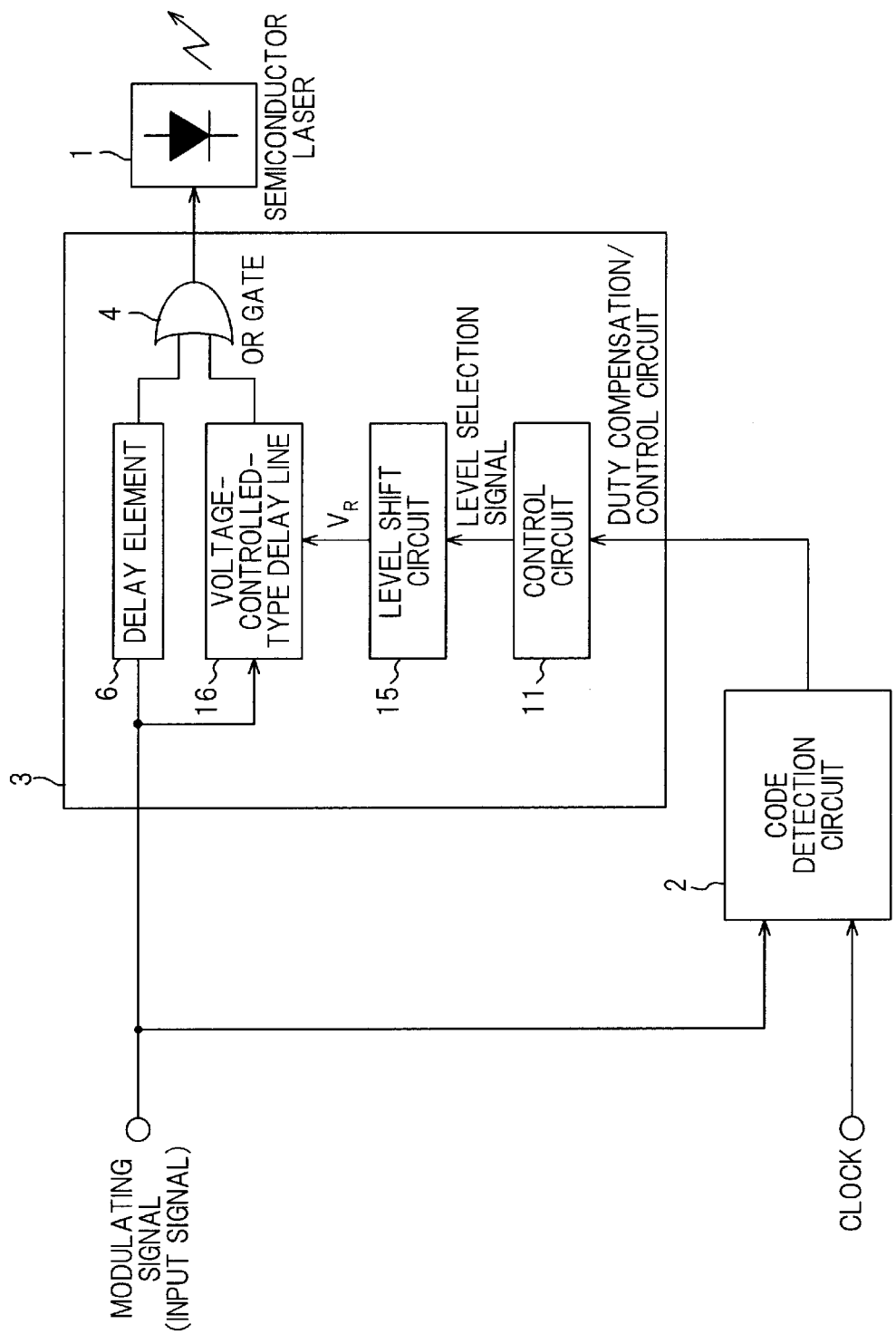
FIG. 23 is a diagram showing the construction of a fifth embodiment of a semiconductor laser driver circuit according to the present invention.
Figure 24:
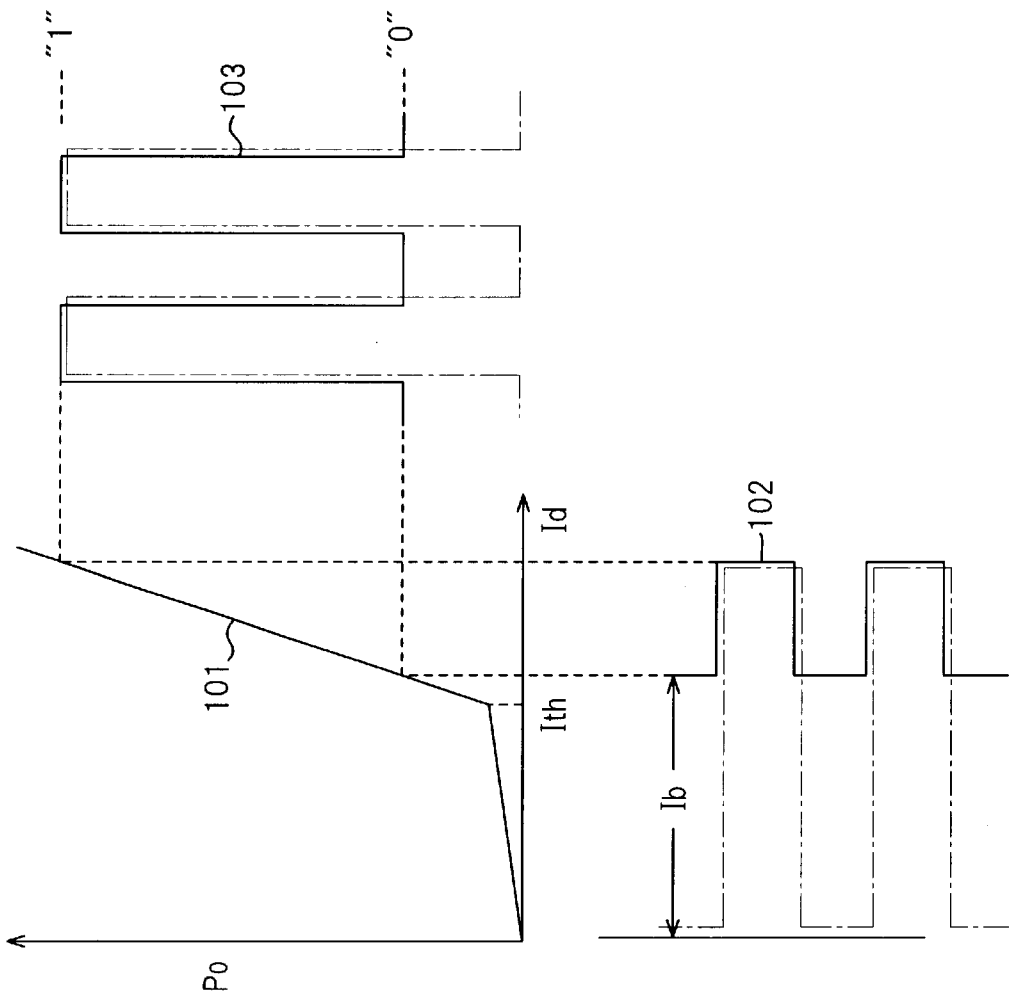
FIG. 24 is a diagram useful in describing a method of modulating a semiconductor laser.
Figure 25:
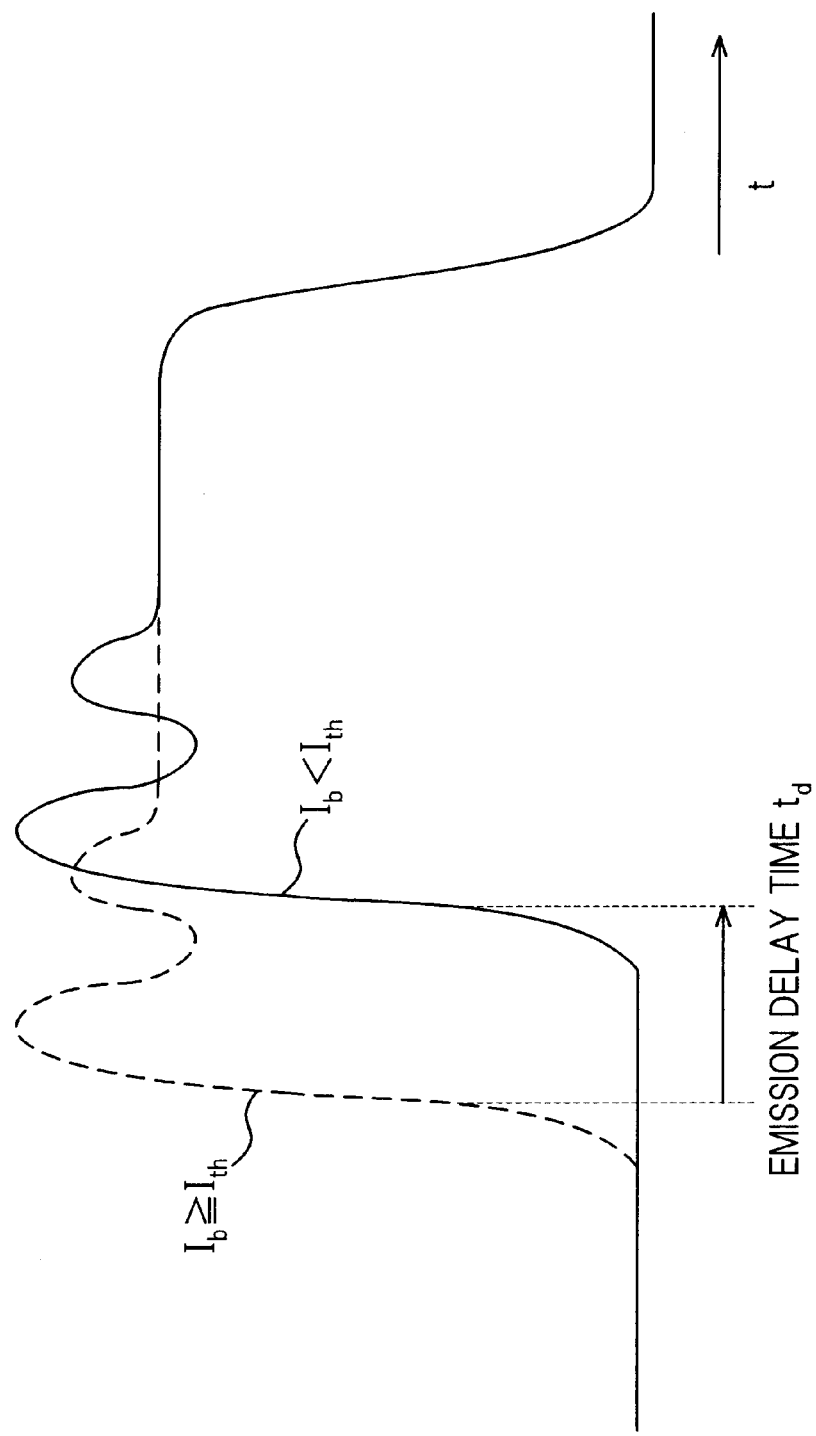
FIG. 25 is a diagram illustrating graphically the pulse-modulated light output of a semiconductor laser.

FIG. 23 is a diagram showing the construction of a fifth embodiment of a semiconductor laser driver circuit according to the present invention. Shown in FIG. 23 are the semiconductor laser 1 the code detection circuit 2 for detecting the code of the input data, and the duty compensation/control circuit 3 (pulse-width adjustment circuit) for adjusting and outputting, on the basis of the detected code, the pulse width of the pulse EP that drives the semiconductor laser 1.

The code detection circuit 2 has a construction the same as that of the code detection circuit shown in FIG. 4. The duty compensation/control circuit 3 includes OR gate 4, delay element 6, control circuit 11, shift circuit 15, and a voltage-controlled-type delay line 16, which changes the delay time of the input signal by the applied voltage. When the voltage applied to the delay line 16 is enlarged, the amount of delay thereof decreases. The amount of delay provided by the delay element 6 is set to be equal to the maximum delay of the delay line 16.

The control circuit 11 discriminates the number of successive "0"s preceding a "1" and outputs a level selection signal conforming to the number of successive "0"s. In a case where n=4 holds, the control circuit 11 has the construction shown in FIG. 13. The shift circuit 15 outputs a level, wherein the larger the number of successive "0"s, the higher the level output. In a case where n=4 holds, the shift circuit 15 has the construction shown in FIG. 21. The voltage-controlled-type delay line 16 can be a voltage-adjusted, high-speed variable delay line (QDG 3001, QDB 1005, QDD 1305, etc.) of CDG-, QDB- or QDD-type manufactured by Elmec Corporation. As mentioned above, the larger the applied voltage, the smaller the amount of delay; the smaller the applied voltage, the greater the amount of delay.

In accordance with the fifth embodiment, the larger the number of successive "0"s preceding a "1", the higher the level $V_R$ output by the shift circuit 15 and the shorter the delay time. As a result, the larger the number of successive "0"s, the more the pulse width of the laser driving pulse EP output by the OR gate can be enlarged.

Thus, in accordance with a semiconductor laser driver circuit according to the present invention, the number of successive "0"s in input data is monitored and it is arranged to control the rising edge and pulse width of the laser driving pulse in dependence upon the number of successive "0"s preceding a "1" in the input data. As a result, rising-edge pattern jitter in zero-bias modulation can be reduced and high-quality transmission can be achieved.

Further, in accordance with the semiconductor laser driver circuit according to the present invention, an optical transmission apparatus can operate stably not only in regard to a burst signal but in regard to all modulating input signals.

Further, in accordance with the semiconductor laser driver circuit according to the present invention, it is possible to eliminate pattern jitter through a simple arrangement. The invention thus contributes greatly to the realization of an optical subscriber system the foremost of which is an ATM network in which low-cost, high-quality optical transmitters are required.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor laser driver circuit driving a semiconductor laser by a pulse signal having levels conforming to "1" and "0" logic values of input data, comprising:

a code detection circuit detecting a prescribed code, which comprises a plurality of successive logic values from the input data, wherein said code detection circuit comprises a detecting unit detecting a three-bit code pattern "101" of successive logic values in the input data, where "1" is a logic value for when current is passed through the semiconductor laser and "0" is a logic value for when no current is passed through the semiconductor laser; and a pulse-width adjustment circuit adjusting pulse width of the pulse signal based upon the code detected by said code detection circuit and outputting the pulse signal, wherein said pulse-width adjustment circuit comprises a delay unit making a pulse width corresponding to the final "1" in the "101" pattern smaller than a pulse width corresponding to the "1" in a three-bit code pattern "001" of successive logic values.

2. A semiconductor laser driver circuit driving a semiconductor laser by a pulse signal having levels conforming to "1" and "0" logic values of input data, comprising:

a code detection circuit detecting a prescribed code, which comprises a plurality of successive logic values from the input data, wherein said code detection circuit comprises a detecting unit detecting a three-bit code pattern "101" of successive logic values in the input data, where "1" is; a logic value for when current is passed through the semiconductor laser and "0" is a logic value For when no current is passed through the semiconductor laser; and a pulse-width adjustment circuit adjusting pulse width of the pulse signal based upon the code detected by said code detection circuit and outputting the pulse signal, wherein said pulse-width adjustment circuit comprises a pulse signal output unit latching the input data and outputting the pulse signal, a clock delay unit delaying a clock signal and outputting the delayed clock signal, and a clock selection circuit selecting one of the clock signal and delayed clock signal, said pulse signal output unit latching the input data in response to the delayed clock signal when a three-bit code is "101", latching the input data in response to the clock signal at all other times and advancing a rising edge of the pulse signal to enlarge the pulse width thereof when a three-bit code is "001".

3. A semiconductor laser driver circuit driving a semiconductor laser by a pulse signal having levels conforming to "1" and "0" logic values of input data, comprising:

a code detection circuit detecting a prescribed code, which comprises a plurality of successive logic values from the input data, wherein said code detection circuit comprises a detecting unit detecting a three-bit code pattern "101" of successive logic values in the input data, where "1" is a logic value for when current is passed through the semiconductor laser and "0" is a logic value for when no current is passed through the semiconductor laser; and a pulse-width adjustment circuit adjusting pulse width of the pulse signal based upon the code detected by said code detection circuit and outputting the pulse signal, wherein said pulse-width adjustment circuit comprises a slanting circuit slanting rising and falling edges of an input data waveform, a discrimination level control circuit increasing a discrimination level when a three-bit code is "101", and a comparing unit comparing an output of the slanting circuit and the discrimination level and outputting the pulse signal based upon the result of the comparison.

4. A semiconductor laser driver circuit driving a semiconductor laser by a pulse signal having a level conforming to a logic value of input data, comprising:

a monitoring unit monitoring number of successive "0" s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein on the basis of a relationship between a number n of successive "0"s in the input data and an emission delay time of a light pulse output by the semiconductor laser, said pulse-width adjustment circuit advances, by an amount equal to the emission delay time, the rising edge of the pulse signal due to a "1" following the actual number n of successive "0"s enlarging the pulse width of the pulse signal.

5. A semiconductor laser driver circuit driving a semiconductor laser by a pulse signal having a level conforming to a logic value of input data, comprising:

a monitoring unit monitoring number of successive "0" s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit fixes an amount of pulse width enlargement to a constant value if the number of successive "0"s is equal to or greater than a predetermined number N.

6. A semiconductor laser driver circuit driving a semiconductor laser by a pulse signal having a level conforming to a logic value of input data, comprising:

a monitoring unit monitoring number of successive "0"s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit obtains from a relationship between a "0" duration in the input data and a light-pulse emission delay time, a "0" duration for which the emission delay time is rendered constant, and decides the predetermined number N from this "0" duration and bit rate of the input data.

7. A semiconductor laser driver circuit driving a semiconductor laser by a pulse signal having a level conforming to a logic value of input data, comprising:

a monitoring unit monitoring number of successive "0"s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit fixes an amount of pulse width enlargement to a constant value if the number of successive "0"s is equal to or greater than a predetermined number N and said pulse-width adjustment circuit comprises a first delay unit making delay time of input data longer the smaller the number of successive "0"s, a second delay unit delaying the input data by an amount equivalent to a maximum delay time set in said first delay unit, and a pulse signal output unit combining outputs of said first and second delay units to produce and output the pulse signal.

8. A semiconductor laser driver circuit driving a semiconductor laser by a pulse signal having a level conforming to a logic value of input data, comprising:

a monitoring unit monitoring number of successive "0"s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit comprises a variable-duty pulse generating circuit outputting a pulse signal having a duty conforming to the number of successive "0"s, and a controller selecting a pulse signal, which conforms to the number of successive "0"s from said variable-duty pulse generating circuit.

9. A semiconductor laser driver circuit driving a semiconductor laser by a pulse signal having a level conforming to a logic value of input data, comprising:

a monitoring unit monitoring number of successive "0" s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit comprises a pulse output unit latching the input data and outputting the pulse signal, a clock delay unit generating a plurality of clock signals having delay times that differ from one another, and a clock selection unit selecting a prescribed clock signal, said pulse signal output unit selecting a clock signal having a delay time that is shorter the larger the number of successive "0"s, and latching the input data in response to this clock signal to advance a rising edge and enlarge the pulse width of the pulse signal.

10. A semiconductor laser driver circuit driving a semiconductor laser by a pulse signal having a level conforming to a logic value of input data, comprising:

a monitoring unit monitoring number of successive "0" s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit comprises a slanting circuit slanting rising and falling edges of an input data waveform, a discrimination level control circuit reducing a discrimination level on the basis of the number of successive "0"s, and a comparing unit comparing an output of the slanting circuit and the discrimination level and outputting the pulse signal based upon the result of the comparison.

11. A semiconductor laser driver circuit driving a semiconductor laser by a pulse signal having a level conforming to a logic value of input data, comprising:

a monitoring unit monitoring number of successive "0"s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit comprises a voltage-controlled-type delay line delaying input data, said delay line having a delay that can be varied voltage applied thereto, a level control circuit controlling a level input to said voltage-controlled-type delay line based upon the number of successive "0"s, and a combining unit combining the input data signal and the delayed data signal output by said delay line producing and outputting the pulse signal.

12. A semiconductor laser driver circuit driving a semiconductor laser by a pulse signal having a level conforming to a logic value of input data, comprising:

a monitoring unit monitoring number of successive "0"s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit fixes amount of pulse width enlargement to a first constant value in a case where the number of successive "0"s is two or greater and fixes the amount of pulse width enlargement to zero in a case where number of successive "0"s is one or less.

13. A semiconductor laser driver circuit driving a semiconductor laser by a pulse signal having a level conforming to a logic value of input data, comprising:

a monitoring unit monitoring number of successive "0" s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit fixes amount of pulse width enlargement to a first constant value in a case where the number of successive "0"s is two or greater and fixes the amount of pulse width enlargement to zero in a case where number of successive "0"s is one or less, and said pulse-width adjustment circuit comprises a pulse output unit latching the input data and outputting the pulse signal, a clock delay unit delaying a clock signal and outputting the delayed clock signal, and a clock selection circuit selecting one of the clock signal and delayed clock signal, said pulse signal output unit latching the input data in response to the delayed clock signal if the number of successive "0"s is one or less, and latching the input data in response to the clock signal if the number of successive "0"s is two or greater advancing a rising edge of the pulse signal to enlarge the pulse width thereof.

14. A semiconductor laser driver circuit driving a semiconductor laser by a pulse signal having a level conforming to a logic value of input data, comprising:

a monitoring unit monitoring number of successive "0" s in the input data, where "1" is a logic value for when current is passed through the semiconductor laser and "0" is a logic value for when no current is passed through the semiconductor laser; and a pulse-width adjustment circuit enlarging pulse width of the pulse signal in dependence upon the number of successive "0"s preceding a "1" in the input data and outputting the pulse signal, wherein said pulse-width adjustment circuit fixes amount of pulse width enlargement to a first constant value in a case where the number of successive "0"s is two or greater and fixes the amount of pulse width enlargement to zero in a case where number of successive "0"s is one or less, and said pulse-width adjustment circuit comprises a slanting circuit slanting rising and falling edges of input data, a discrimination level control circuit reducing a discrimination level if the number of successive "0"s is two or greater, and a comparing unit comparing an output of the slanting circuit and the discrimination level and outputting the pulse signal.

* * * * *

UNITED STATES PATENT AND TRADEMARK OFFICE
CERTIFICATE OF CORRECTION

PATENT NO. : 6,256,329 B1
DATED : July 3, 2001
INVENTOR(S) : Atsuo Ishizuka et al.

It is certified that error appears in the above-identified patent and that said Letters Patent is hereby corrected as shown below:

Column 17,
Line 51, after "is" (first occurrence), delete ";".
Line 53, change "For" to -- for --.

Signed and Sealed this

Eleventh Day of December, 2001

Attest:

*Nicholas P. Godici*

NICHOLAS P. GODICI
*Attesting Officer*      *Acting Director of the United States Patent and Trademark Office*